United States Patent
Finn et al.

(10) Patent No.: US 9,449,269 B2
(45) Date of Patent: Sep. 20, 2016

(54) METHODS AND APPARATUS FOR EMBEDDING WIRE IN SUBSTRATES FOR SECURE DOCUMENTS

(71) Applicants: David Finn, Tourmakeady (IE); Jan Thomas Czornack, Apfeldorf (DE)

(72) Inventors: David Finn, Tourmakeady (IE); Jan Thomas Czornack, Apfeldorf (DE)

(73) Assignee: Féinics AmaTech Teoranta, Lower Churchfield, Tourmakeady, County Mayo (IE)

( * ) Notice: Subject to any disclaimer, the term of this patent is extended or adjusted under 35 U.S.C. 154(b) by 0 days.

(21) Appl. No.: 14/714,290

(22) Filed: May 16, 2015

(65) Prior Publication Data

US 2015/0356399 A1   Dec. 10, 2015

Related U.S. Application Data

(63) Continuation of application No. 14/020,884, filed on Sep. 8, 2013, now Pat. No. 9,033,250.

(60) Provisional application No. 61/868,089, filed on Aug. 21, 2013, provisional application No. 61/860,354, filed on Jul. 31, 2013, provisional application No. 61/841,286, filed on Jun. 29, 2013, provisional application No. 61/737,746, filed on Dec. 15, 2012.

(51) Int. Cl.

| | |
|---|---|
| *G06K 19/077* | (2006.01) |
| *H01Q 1/22* | (2006.01) |
| *H01Q 7/00* | (2006.01) |
| *H01Q 21/29* | (2006.01) |
| *H05K 1/16* | (2006.01) |

(Continued)

(52) U.S. Cl.
CPC ... *G06K 19/07794* (2013.01); *G06K 19/07769* (2013.01); *G06K 19/07783* (2013.01); *H01Q 1/2216* (2013.01); *H01Q 1/2225* (2013.01); *H01Q 1/2283* (2013.01); *H01Q 7/00* (2013.01); *H01Q 21/29* (2013.01); *H05K 1/165* (2013.01); *H01F 38/14* (2013.01); *H05K 3/103* (2013.01); *H05K 2201/10098* (2013.01); *Y10T 29/49018* (2015.01); *Y10T 29/49162* (2015.01)

(58) Field of Classification Search
CPC ............. G06K 19/07794; G06K 19/07769; G06K 19/07783; H05K 1/165; H05K 3/103; H05K 2201/10098; Y10T 29/49018; Y10T 29/49162; H01Q 1/2225; H01Q 1/2283; H01K 7/00; H01K 1/2216; H01K 21/29; H01F 38/14

See application file for complete search history.

(56) References Cited

U.S. PATENT DOCUMENTS

| | | | |
|---|---|---|---|
| 5,783,008 A * | 7/1998 | Belke, Jr. | B60R 16/0207 156/298 |
| 5,955,723 A | 9/1999 | Reiner | |

(Continued)

FOREIGN PATENT DOCUMENTS

| | | |
|---|---|---|
| DE | 20 2005 016382 | 2/2006 |
| EP | 1225538 | 7/2002 |

(Continued)

*Primary Examiner* — Kristy A Haupt
(74) *Attorney, Agent, or Firm* — Gerald E. Linden

(57) ABSTRACT

A booster antenna (BA) for a smart card comprises a card antenna (CA) component extending around a periphery of a card body (CB), a coupler coil (CC) component at a location for an antenna module (AM), and an extension antenna (EA) contributing to the inductance of the booster antenna (BA). A method of wire embedding is also disclosed, by controlling a force and ultrasonic power applied by an embedding tool at different positions on the card body (CB).

19 Claims, 16 Drawing Sheets

(51) Int. Cl.
*H05K 3/10* (2006.01)
*H01F 38/14* (2006.01)

(56) References Cited

U.S. PATENT DOCUMENTS

| | | |
|---|---|---|
| 6,233,818 B1 | 5/2001 | Finn et al. |
| 6,378,774 B1 | 4/2002 | Emori et al. |
| 6,698,089 B2 | 3/2004 | Finn et al. |
| 8,130,166 B2 | 3/2012 | Ayala et al. |
| 8,366,009 B2 | 2/2013 | Finn |
| 8,474,726 B2 | 7/2013 | Finn |
| 8,991,712 B2 | 3/2015 | Finn |
| 2001/0054230 A1* | 12/2001 | Finn .................... G06K 19/077 29/748 |
| 2009/0250171 A1* | 10/2009 | Wieduwilt ............. B29C 65/08 156/378 |
| 2013/0075477 A1 | 3/2013 | Finn et al. |
| 2013/0146671 A1 | 6/2013 | Grieshofer et al. |

FOREIGN PATENT DOCUMENTS

| | | |
|---|---|---|
| EP | 2045872 | 4/2009 |
| EP | 2525304 | 11/2012 |
| KR | 100537452 | 12/2005 |
| NL | 9100347 | 3/1992 |

\* cited by examiner

Dual Interface (DI) Smart Card, and Readers different areas of the Card Body (CB)

Booster Antenna BA with Card Antenna CA and Coupler Coil CC booster antenna components inclusion of an antenna extension AE

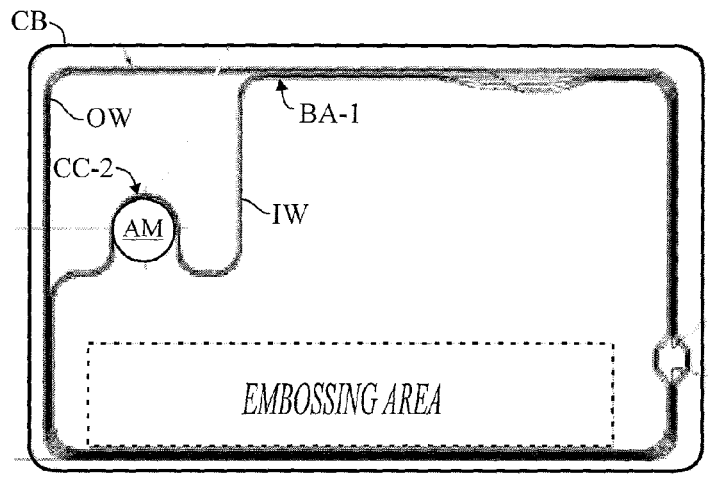
FIG. 5F
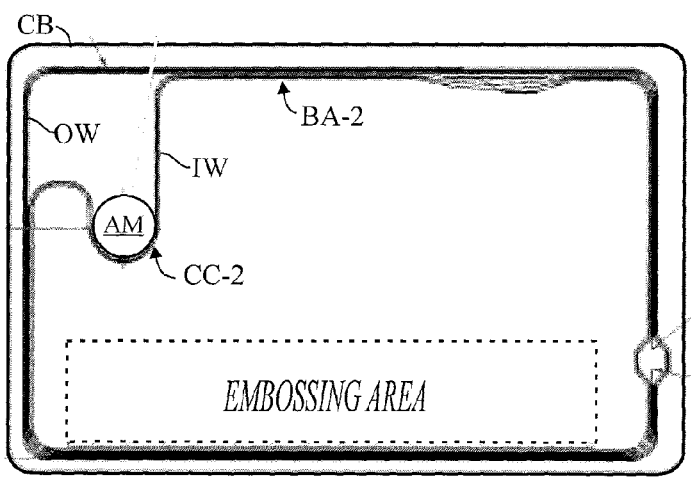
FIG. 5G
FIG. 5H
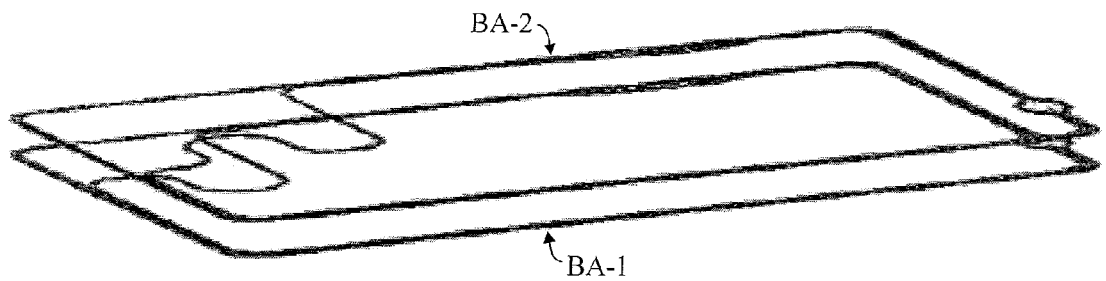

pitch increases across width of card body (CB)

zig-zag for increased capacitance dipole extending along 3 edges of periphery turns of wire embedded in Card Body CB

METHODS AND APPARATUS FOR EMBEDDING WIRE IN SUBSTRATES FOR SECURE DOCUMENTS

CROSS-REFERENCE(S) TO RELATED APPLICATIONS

This is a continuation/division of Ser. No. 14/020,884 filed 8 Sep. 2013 (U.S. Pat. No. 9,033,250, 19 May 2015) which is a continuation-in-part ("CIP") or nonprovisional of the following:
nonprovisional of 61/868,089 filed 21 Aug. 2013
nonprovisional of 61/860,354 filed 31 Jul. 2013
nonprovisional of 61/841,286 filed 29 Jun. 2013
nonprovisional of 61/737,746 filed 15 Dec. 2012

TECHNICAL FIELD

This disclosure relates to smart cards (or other secure documents, and the like), operating at least in a contactless mode (ISO 14443). The smart card may comprise a card body (CB), an antenna module (AM), and a booster antenna (BA). The antenna module (AM) may comprise an RFID (radio frequency identification) chip or chip module (either of which may be referred to as "CM") and a module antenna (MA). The RFID chip (CM) may be mounted on a module tape (MT), typically having 6 or 8 contact pads (CP) for interfacing with a contact reader in a contact mode (ISO 7816-2). The booster antenna (BA) may comprise various antenna components, such as a card body antenna (CA) for coupling with an external contactless reader, and a coupling coil (CC) for coupling with the module antenna (MA) of the antenna module (AM).

This disclosure further relates to techniques for embedding wire in a substrate, such as a card body (CB) for a smart card (or other secure documents, and the like), particularly to form the booster antenna (BA) and its various antenna components.

BACKGROUND

A dual interface (DI or DIF) smart card may generally comprise:
an antenna module AM,
a card body CB, and
a booster antenna BA.

The antenna module "AM" may generally comprise a "DI" RFID chip (bare, unpackaged silicon die) or chip module (a die with leadframe, carrier or the like)—either of which may be referred to as "CM"—mounted to a module tape "MT". A module antenna MA may be disposed on the module tape MT for implementing a contactless interface. Contact pads "CP" may be disposed on the module tape MT for implementing the contact interface. The module tape MT may comprise a pattern of interconnects (conductive traces and pads) to which the chip CM and contact pads CP may be connected.

The module antenna MA may be connected, indirectly, via some of the interconnects to the chip CM, or may be directly connected to bond pads BP on the chip CM. The module antenna MA may comprise several turns of wire, such as 112 micron diameter insulated wire. Reference may be made to U.S. Pat. No. 6,378,774 (2002, Toppan), for example FIGS. 12A, B thereof.

The card body CB— which may be referred to as a substrate, or an inlay substrate—may generally comprise one or more layers of material such as Polyvinyl Chloride (PVC), Polycarbonate (PC), PET-G (Polyethylene Terephtalate Glycol-modified), Copolyester (Tritan), Teslin™, synthetic paper, paper and the like.

The card body CB may be generally rectangular, measuring approximately 54 mm×86 mm (refer to ISO/IEC 7810), having a thickness of approximately 300 μm thick. The card body CB is typically significantly (such as 20 times) larger than the antenna module AM.

The booster antenna BA may generally comprise a relatively large winding which may be referred to as a card antenna CA component (or portion) having a number of turns disposed in a peripheral area of the card body CB, and a relatively small coupler coil (or coupler antenna) CC component (or portion) having a number of turns disposed at a coupling area of the card body CB corresponding to the antenna module AM.

The card antenna CA and coupler coil CC may comprise wire mounted to (embedded in) the card body CB using an ultrasonic tool comprising a sonotrode and a capillary. See, for example U.S. Pat. No. 6,698,089 and U.S. Pat. No. 6,233,818. The wire may be non-insulated, insulated, or self-bonding wire, having an exemplary diameter in the range of approximately 50-112 μm.

SOME PRIOR ART REFERENCES

NL 9100347 (1992, Nedap) discloses a contactless card having the following elements arranged as shown in FIG. 1; (1) geintegreerde schakeling (integrated circuit); (2) electronische schakeling (electronic circuit); (3) transformator (transformer); (4) kernmateriaal (core material); (5) condensator (condenser); (6) primaire spoel (primary coil) and (7) antennespoel (antenna coil)

As is evident from FIG. 1 of the Nedap patent, the electronic circuit (2, comparable to the chip CM herein) is connected with a first coil (3, comparable to the module antenna MA herein). A second coil (6, comparable to the coupling coil CC herein) is connected with the main antenna (1, comparable to the card antenna CA herein). The first coil (3, MA) is coupled with the second coil (6, CC), as aided by the core material (4).

U.S. Pat. No. 5,955,723 (Siemens; 1999), incorporated by reference herein, discloses a contactless chip card. A data carrier configuration includes a semiconductor chip. A first conductor loop is connected to the semiconductor chip and has at least one winding and a cross-sectional area with approximately the dimensions of the semiconductor chip. At least one second conductor loop has at least one winding, a cross-sectional area with approximately the dimensions of the data carrier configuration and a region forming a third loop with approximately the dimensions of the first conductor loop. The third loop inductively couples the first conductor loop and the at least one second conductor loop to one another. The first and third conductor loops are disposed substantially concentrically. FIGS. 1 and 2 illustrate that a large coil, that is to say a second conductor loop 3, has approximately the dimensions of a chip card. FIG. 1 illustrates a way of forming the small loop 4 of the large coil 3 without any crossovers, whereas FIG. 2 illustrates a small loop 4 having a crossover. FIG. 3 shows a further possible configuration of a coupling region between a small conductor loop 2 connected to a semiconductor chip 1, and a large conductor loop 3. In this case, the coupling region has a meandering path, in order to obtain as long a length of the coupling region as possible.

U.S. Pat. No. 8,130,166 (Assa Abloy; 2012), incorporated by reference herein, discloses coupling device for transponder and smart card with such device. A coupling device is formed by a continuous conductive path having a central section and two extremity sections, the central section forming at least a small spiral for inductive coupling with the transponder device, the extremities sections forming each one large spiral for inductive coupling with the reader device, wherein the small spiral shows a larger pitch than the ones of the large spirals, and wherein the two extremities of the continuous path are loose such that the coupling device forms an open circuit. The pitches of the large spirals are chosen such as that the interturn stray capacitances is important and that the large spirals have mainly a capacitive behavior. And the pitch of the small spiral is chosen such as that the interturn stray capacitances are negligible, and that the small spiral has mainly an inductive behavior. FIG. 3 shows an illustrative embodiment of the transponder device and coupling device. The coupling device 10 is formed by a single conductive path having a central section and two external sections. The central portion is formed as a small spiral 12 with a large pitch, whereas the two external sections form a large spiral 11 and 11' with a small pitch. In fact, the spiral 11 and 11' are two distinct spiral physical elements, but forming a single geometrical spiral element (with a short interruption in the middle).

US 20130146671 (Infineon; 2013), incorporated by reference herein, discloses a booster antenna structure for a chip card is provided, wherein the booster antenna structure may include a booster antenna; and an additional electrically conductive structure connected to the booster antenna. [0003] The contactless interface on the chip card can have a chip card antenna which is contained in the chip card and connected to the chip. [0004] In order to improve the wireless communication capability, a further antenna can be provided in addition to the chip card module antenna, namely an amplifier antenna or booster antenna.

U.S. Pat. No. 8,474,726 (Finn; 2013), incorporated by reference herein, discloses a transponder with an antenna module having a chip module and an antenna; a booster antenna having a first antenna structure in the form of a flat coil having a number of turns, an outer end and an inner end, and a second antenna structure in the form of a flat coil having a number of turns, an outer end and an inner end; the inner end of the second antenna structure connected with the outer end of the first antenna structure. The antenna module may be positioned so that its antenna overlaps one of the first antenna structure or the second antenna structure. An antenna module having two additional antenna structures is disclosed. Methods of enhancing coupling are disclosed.

US 20130075477 (Finn, Ummenhofer; 2013), incorporated by reference herein, discloses improving coupling in and to RFID smart cards. A data carrier such as a smart card comprising an antenna module (AM) and a booster antenna (BA). The booster antenna (BA) has an outer winding (OW) and an inner winding (IW), each of which has an inner end (IE) and an outer end (OE). A coupler coil (CC) is provided, connecting the outer end (OE, b) of the outer winding (OW) and the inner end (IE, e) of the inner winding (IW). The inner end (IE, a) of the outer winding (OW) and the outer end (OE, f) of the inner winding (IW) are left un-connected (free floating). The coupler coil (CC) may have a clockwise (CW) or counter-clockwise (CCW) sense which is the same as or opposite to the sense (CW or CCW) of the outer and inner windings. Various configurations of booster antennas (BA) are disclosed.

SUMMARY

It is a general object of the invention to provide improved techniques for improving coupling with RFID smart cards (as an example of secure documents, and the like). It is a further general object of the invention to provide an improved booster antenna (BA) for smart cards. It is a further general object of the invention to provide improved techniques for embedding wire in a card body (CB) of a smart card. These and other objects may be achieved individually or collectively by various embodiments of the invention disclosed herein.

The booster antenna BA may comprise a card antenna CA component, a coupler coil (or coupler antenna) CC component, and an extension antenna (or extension coil) EA component. According to some embodiments of the invention generally, improvements to the booster antenna BA may include one or more of:
- arrangements of the card antenna CA, which may have only one winding, or which may comprise two or more windings such as an inner winding IW and an outer winding OW
- arrangements of the coupler coil (or coupler antenna) CC, which may comprise a loop which completely encircles a coupling area on the card body CB associated with the antenna module AM, or which may comprise an incomplete or open loop (or "horseshoe") which substantially fully but which does not completely encircle the coupling area (and antenna module AM)

Some features disclosed herein and related to the booster antenna (BA) may include:
- various configurations of an extension antenna (or extension coil; EA), which may be connected to and extend from at least one of the card antenna (CA) and the coupler coil (CC)
- the extension antenna (EA) may be a "true coil" having at least one cross-over Some features disclosed herein and related to the booster antenna (BA) may include:
- disposing the coupler coil (CC) off-center with respect to the module antenna (MA) of the antenna module (AM) (FIG. 5A)
- forming the coupler coil (CC) with a free end (FIG. 5B)
- forming the coupler coil (CC) with two, side-by-side windings which are extensions of the card antenna (CA) (FIG. 5C)
- forming the coupler coil (CC) with two windings, each having free ends (FIG. 5D)
- forming a first booster antenna (BA-1) and partial coupling coil (CC-1) in a first layer, and forming a second booster antenna (BA-2) and partial coupling coil (CC-2) in a second layer (or an opposite side of the first layer. (FIGS. 5E,F,G)

Some features disclosed herein and related to the booster antenna (BA) may include:
- windings (turns) of CA, CC or CA having different pitches/spacings
- wire for the CA, CC or EA having different thicknesses
- wire for the CA, CC or EA having different resistances According to some embodiments of the invention generally, improvements to embedding wire in a card body CB with an embedding tool comprising a ultrasonic sonotrode and a capillary may include one or more of:
- controlling force applied by the capillary during embedding the wire
- controlling power in the sonotrode during embedding the wire According to an embodiment (example) of the invention a card body (CB) may comprise:
- a surface having a surface area, an upper portion of the surface constituting approximately half of the surface area of the card body and a lower portion of the surface constituting a remaining approximately half of the surface area of the card body;

a first area for extending around a peripheral portion of the card body in at least the upper portion of the card body;

a card antenna (CA) disposed in the first area;

a second area located in the upper portion of the card body and corresponding in size to an antenna module (AM);

a third area located in the upper portion of the card body which is separate from the first area and the second area; and an extension antenna (EA) disposed in the third area.

A coupler coil (CC) may be disposed in the second area. A portion of the extension antenna (EA) may be disposed adjacent at least 90° of the coupler coil (CC). The coupler coil (CC) may have two ends, and may be formed as a closed loop or as an open loop.

The extension antenna (EA) contributes to the inductance of the booster antenna (BA), and may be in the form of a coil comprising at least one cross-over. The extension antenna (EA) may be connected at one end to the booster antenna (BA). The extension antenna (EA) has two ends. One end may be connected to an end of the coupler coil (CC). One end may be connected to the card antenna (CA), or left unconnected as a free end.

According to an embodiment (example) of the invention a smart card may comprise a card body (CB) having a booster antenna (BA) with an extension antenna (EA), and a radio frequency identification (RFID) chip, and may have a coupler coil (CC).

According to an embodiment (example) of the invention a method of embedding a wire in a surface of a substrate may comprise:

with an embedding tool, feeding wire onto the surface of the substrate while applying a given downward force and while imparting an ultrasonic vibration to the embedding tool; and controlling at least one of the downward force which is exerted by the embedding tool and a power of the ultrasonic vibration while embedding the wire in the surface of the substrate.

A linear actuator may be used for urging at least a portion of the embedding tool downward. A force profile may be established, and different forces may be applied at different positions, during the embedding process, in a controlled manner. While controlling the force, a power of the ultrasonic vibration imparted to the embedding tool may also be controlled. Different downward forces may be applied by the embedding tool at different positions being embedded, and for a booster antenna component having a plurality of turns, this may depend upon which of the plurality of turns is being embedded.

The invention(s) described herein may relate to industrial and commercial industries, such RFID applications, smart cards, electronic passports and the like.

Other objects, features and advantages of the invention(s) disclosed herein may become apparent in light of the following illustrations and descriptions thereof.

BRIEF DESCRIPTION OF THE DRAWINGS

Reference will be made in detail to embodiments of the disclosure, non-limiting examples of which may be illustrated in the accompanying drawing figures (FIGs). The figures may generally be in the form of diagrams. Some elements in the figures may be exaggerated, others may be omitted, for illustrative clarity. Some figures may be in the form of diagrams.

Although the invention is generally described in the context of various exemplary embodiments, it should be understood that it is not intended to limit the invention to these particular embodiments, and individual features of various embodiments may be combined with one another. Any text (legends, notes, reference numerals and the like) appearing on the drawings are incorporated by reference herein. Some elements may be referred to with letters ("BA", "CA", "CC", "EA" and the like), rather than or in addition to numerals.

FIGS. 5F, 5G, 5H are diagrams (5F, 5G, plan view; 5H perspective view) a composite booster antenna having a first booster antenna (BA-1) in one plane, such as on one side of a card body (CB) and a second booster antenna (BA-2) in another plane, such as on an opposite side of the card body (CB).

DETAILED DESCRIPTION

Figure 1:
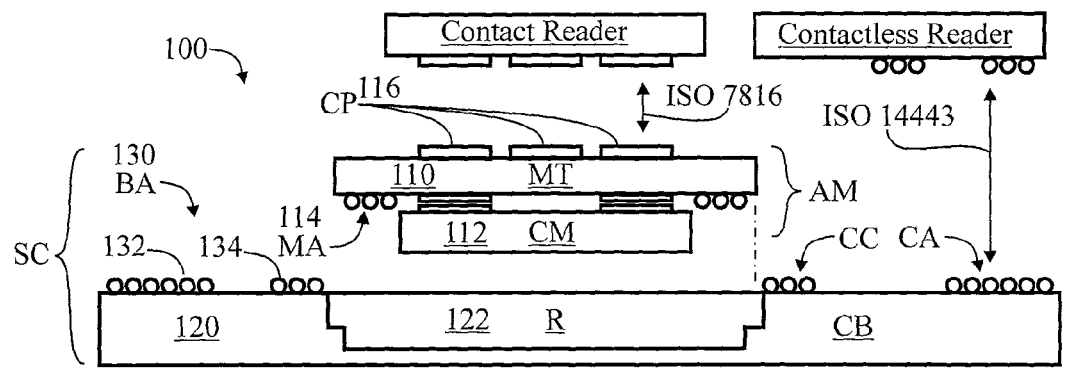
FIG. 1 is a cross-section of a dual-interface smart card and readers.

Various embodiments will be described to illustrate teachings of the invention(s), and should be construed as illustrative rather than limiting. Any dimensions and materials or processes set forth herein should be considered to be approximate and exemplary, unless otherwise indicated.

In the main hereinafter, RFID cards, electronic tags and secure documents in the form of pure contactless cards, dual interface cards, phone tags, electronic passports, national identity cards and electronic driver licenses may be discussed as exemplary of various features and embodiments of the invention(s) disclosed herein. As will be evident, many features and embodiments may be applicable to (readily incorporated in) other forms of smart cards, such as EMV payment cards, metal composite cards, metal hybrid cards, metal foil cards, access control cards and secure credential documents. As used herein, any one of the terms "transponder", "tag", "smart card", "data carrier" and the like, may be interpreted to refer to any other of the devices similar thereto which operate under ISO 14443 or similar RFID standard. The following standards are incorporated in their entirety by reference herein:

ISO/IEC 14443 (Identification cards—Contactless integrated circuit cards—Proximity cards) is an international standard that defines proximity cards used for identification, and the transmission protocols for communicating with it.

ISO/IEC 7816 is an international standard related to electronic identification cards with contacts, especially smart cards.

EMV standards define the interaction at the physical, electrical, data and application levels between IC cards and IC card processing devices for financial transactions. There are standards based on ISO/IEC 7816 for contact cards, and standards based on ISO/IEC 14443 for contactless cards.

A typical data carrier described herein may comprise
(i) an antenna module (AM) having an RFID chip (CM; or chip module) and a module antenna (MA),
(ii) a card body (CB) and
(iii) a booster antenna (BA) with coupler coil (CC) disposed on the card body (CB) to enhance coupling between the module antenna (MA) and the antenna of an external RFID "reader".

When "chip module" is referred to herein, it should be taken to include "chip", and vice versa, unless explicitly otherwise stated.

The module antenna (MA) may comprise a coil of wire, conductive traces etched or printed on a module tape (MT) or antenna substrate (AS) for the antenna module (AM), or may be incorporated directly on the chip itself.

Throughout the various embodiments disclosed herein, unless specifically noted otherwise (in other words, unless excluded), the element referred to as "CM" will most appropriately be a bare integrated circuit (IC) die (or RFID chip), rather than a chip module (a die with a carrier). In contrast therewith, some figures present examples that are specifically "chip modules" having IC chips (such as a "CM") mounted and connected to substrates. A "chip module" (die and carrier) with a module antenna (MA) mounted and connected thereto may be referred to as an antenna module (AM).

The booster antenna (BA) with coupler coil (CC) may be formed by embedding wire in an inlay substrate or card body (CB). However, it should be understood that the antenna may be formed using processes other than by embedding wire in a substrate, such as additive or subtractive processes such as printed antenna structures, coil winding techniques (such as disclosed in U.S. Pat. No. 6,295,720), antenna structures formed on a separate antenna substrate and transferred to the inlay substrate (or layer thereof), antenna structures etched (including laser etching) from a conductive layer on the substrate, structured nanowire networks (including laser ablation) on the substrate, conductive material deposited on the substrate or in channels formed in the substrate, or the like. When "inlay substrate" is referred to herein, it should be taken to include "card body", and vice versa, as well as any other substrate for a secure document, unless explicitly otherwise stated.

The descriptions that follow are mostly in the context of dual interface (DI, DIF) smart cards, and relate mostly to the contactless operation thereof. Many of the teachings set forth herein may be applicable to electronic passports and the like having only a contactless mode of operation. Generally, any dimensions set forth herein are approximate, and materials set forth herein are intended to be exemplary.

Figure 1A:
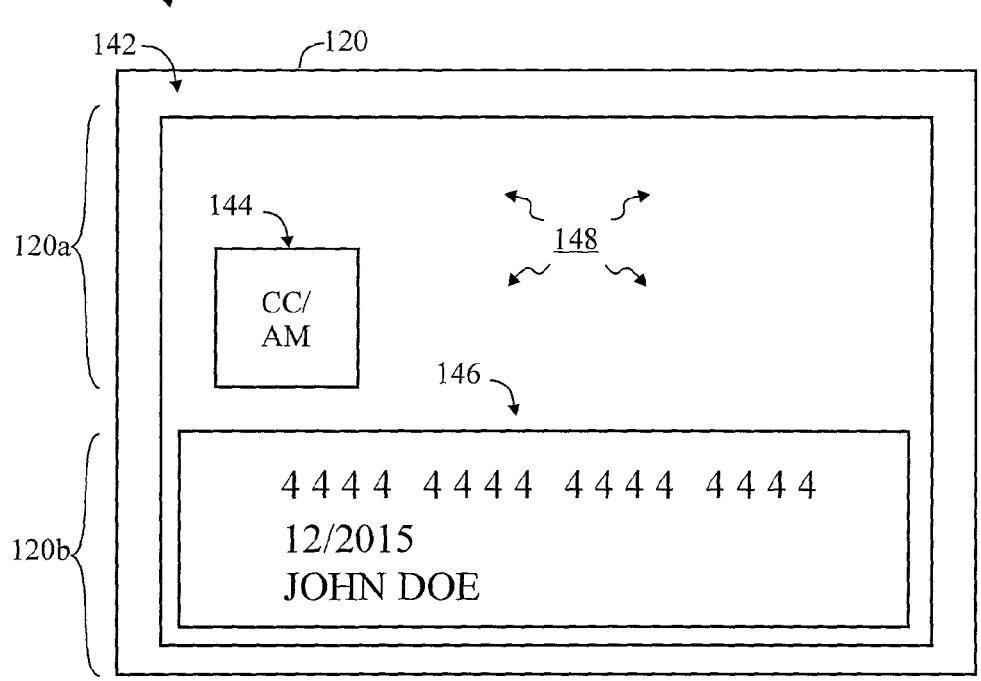
FIG. 1A is a top view of a card body (CB) for the smart card of FIG. 1.

FIGS. 1 and 1A illustrate a smart card (SC) 100 in cross-section, along with a contact reader and a contactless reader. The antenna module AM may comprise a module tape (MT) 110, an RFID chip (CM) 112 disposed on one side of the module tape MT along with a module antenna (MA) 114 and contact pads (CP) 116 disposed on the other side of the module tape MT for interfacing with an external contact reader. The card body (CB) 120 comprises a substrate which may have a recess (R) 122 extending into one side thereof for receiving the antenna module AM. (The recess R may be stepped— such as wider at the surface of the card body CB— to accommodate the profile of the antenna module AM.) The booster antenna (BA) 130 may comprise turns (or traces) of wire (or other conductor) embedded in (or disposed on) the card body CB, and may comprise a number of components such as (i) a card antenna (CA) component 132 and (ii) a coupler coil (CC) component 134.

The card body (CB) 120 has a surface with an overall surface area, such as approximately 54 mm×86 mm~=4600 mm$^2$. An upper portion 120a of the card body CB may constitute approximately half (such as 50-70%) of the overall surface area of the card body CB, and a lower portion 120b of the card body CB may constitute a remaining approximately half (such as 30-50%) of the overall surface area of the card body CB.

A "peripheral" area 142 of the surface of the card body CB extends around the periphery of the card body CB in at least the upper portion 120a thereof, and may have a width of up to approximately 5 mm. The card antenna CA component may be disposed in this first area. The width of the first, peripheral area 142 may be greatest at the top edge of the card body CB, of medium width at the side edges of the card body CB, and least at the bottom edge of the card body CB.

A "coupling" area 144 of the surface of the card body CB is located in an interior area (within the peripheral area 142) of the card body CB, in the upper portion 120a thereof, at a position corresponding to the location of the antenna module AM, and may be of approximately the same size as the antenna module AM, such as approximately 8.2 mm×10.8 mm for a 6-contact module and 11.8 mm×13 mm for an 8-contact module.

An "embossing" area 146 of the surface of the card body CB is located in an interior area (within the peripheral area 142) of the card body CB, in the lower portion 120b thereof, is separate from the peripheral area 142 and the coupling area 144, and may constitute most (such as 80-90%) of the lower portion 120b of the card body CB.

A "remaining" (or "residual") area 148 of the surface of the card body CB is located in an interior area (within the peripheral area 142) of the card body CB, in the upper portion 120a thereof, is separate from the peripheral area 142 and the coupling area 144, and may constitute most (such as 60-80%) of the upper portion 120b of the card body CB. The card antenna 132 and coupler coil 134 are not disposed in this remaining area 148—in other words, are disposed substantially entirely in areas (142, 144) other than the remaining area 148 (and other than the embossing area 146).

As described in greater detail hereinbelow, according to an aspect of the invention, generally, an additional booster antenna component, referred to herein as an antenna extension (EA) component, may be disposed in remaining (or residual) area 148 of the surface of the card body CB. The antenna extension EA may comprise several turns (or traces) of wire (or other conductive material), and may be either (i) connected with one or both of the card antenna CA and coupler coil CC or (ii) not connected with either of the card antenna CA and coupler coil CC.

It is generally not desirable, but nevertheless possible that some of the booster antenna BA components, particularly at least a portion of the card antenna CA and a portion of the extension antenna EA may extend into the embossing area (146). In such a scenario, flat ribbon wire may be used. A wire for the booster antenna BA may be pre-flattened in an area which will correspond to where the wire will be disposed in the embossing area (146).

An Example of a Booster Antenna (BA)

The aforementioned US 20130075477, incorporated by reference herein, discloses a booster antenna BA arrangement (configuration) for a smart card. The booster antenna BA generally comprises a card antenna CA and a coupler coil.

A card antenna CA may comprise a single wire (or conductive trace) having two ends, arranged in a generally a rectangular spiral pattern, and disposed in the peripheral area (see 142, FIG. 1A) of the card body CB. The card antenna CA may comprise different portions, such as disclosed in U.S. Pat. No. 8,130,166 (Assa Abloy; 2012). The card antenna CA may comprise two distinct windings, such as an inner winding IW and an outer winding OW. A coupler coil CC may or may not be associated with the card antenna CA. The card antenna CA and coupler coil CC may constitute two components of a booster antenna BA.

According to an aspect of the invention, a component, referred to herein as an antenna extension EA may be associated with the booster antenna BA, and may be used with any suitable configuration of card antenna CA and coupler coil CC.

Figure 2:
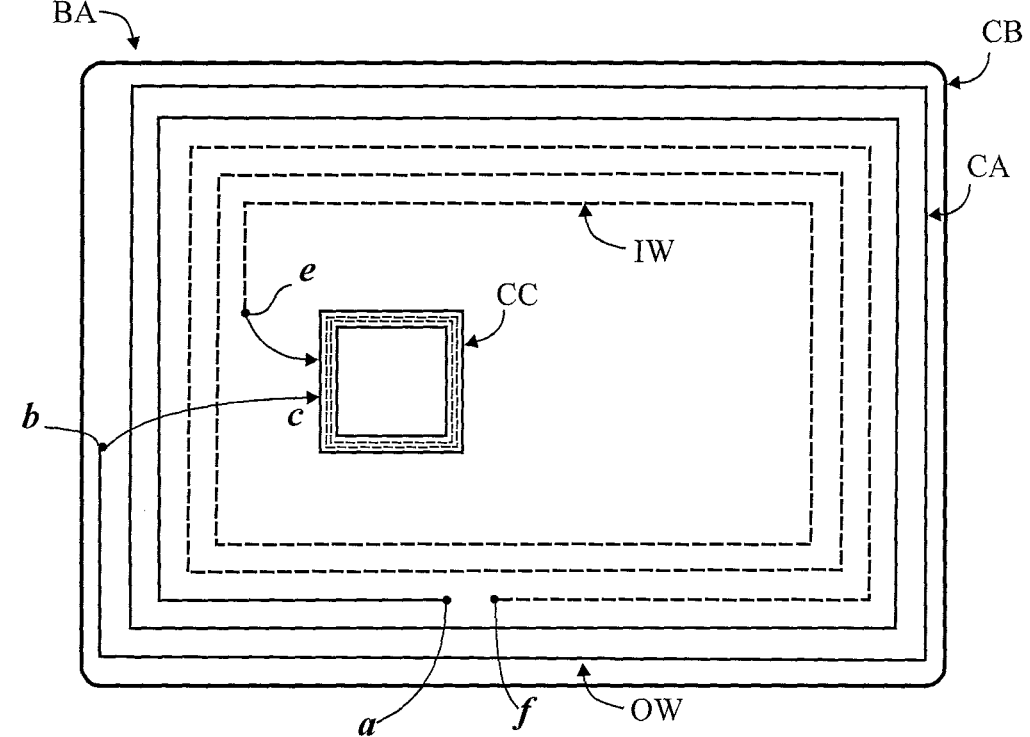
FIG. 2 is a diagram of an embodiment of a booster antenna (BA) having a card antenna (CA) with an inner winding (IW) and an outer winding (OW), and a coupler coil (CC).

FIG. 2 shows a booster antenna BA comprising a card antenna CA component extending around the peripheral area (142) of a card body CB, and having two windings—an outer winding OW and an inner winding IW, both extending substantially around the peripheral area (142) of the card body CB. Additionally, a coupler coil CC is shown which may be disposed in the coupling area (144).

The booster antenna BA may be formed using insulated, discrete copper wire disposed (such as ultrasonically bonded) around (inside of) the perimeter (periphery) of a card body CB (or inlay substrate, or data carrier substrate, such as formed of thermoplastic). The booster antenna BA comprises an outer winding OW (or coil, D) and an inner winding IW (or coil, D), and further comprises a coupler coil CC, all of which, although "ends" of these various coil elements are described, may be formed from one continuous length of wire (such as 80 µm self-bonding wire) which may be laid upon or embedded in the card body CB. More particularly, The outer winding OW may be a long wire (or conductive trace) wire having two ends—an inner end "a" and an outer end "b"—mounted to the card body CB in the form of a rectangular spiral having a number of (at least one) turns, and may be disposed in the peripheral area (142) of the card body CB.

The outer winding OW (compare D, FIG. 1A) may be formed as a spiral having a number (such as 2-3) of turns and having an inner end IE at point "a" and an outer end OE at point "b". The outer winding OW is near (substantially at) the periphery (perimeter) of the card body CB. The inner end IE ("a") of the outer winding OW is a free end.

The dimensions of the card body CB may be approximately 54 mm×86 mm. The outer dimension of the outer winding OW of the booster antenna BA may be approximately 80×50 mm. The wire for forming the booster antenna BA may having a diameter (d) of approximately 100 µm (including, but not limited to 80 mm, 112 µm, 125 µm).

The inner winding IW may be a long wire (or conductive trace) having two ends—an inner end "e" and an outer end "f"—mounted to the card body in the form of a rectangular spiral having a number (at least one) of turns, and may be disposed in the peripheral area (142) of the card body CB. The inner winding IW may be disposed within (towards the interior of the card body CB) the outer winding OW.

Figure 2A:
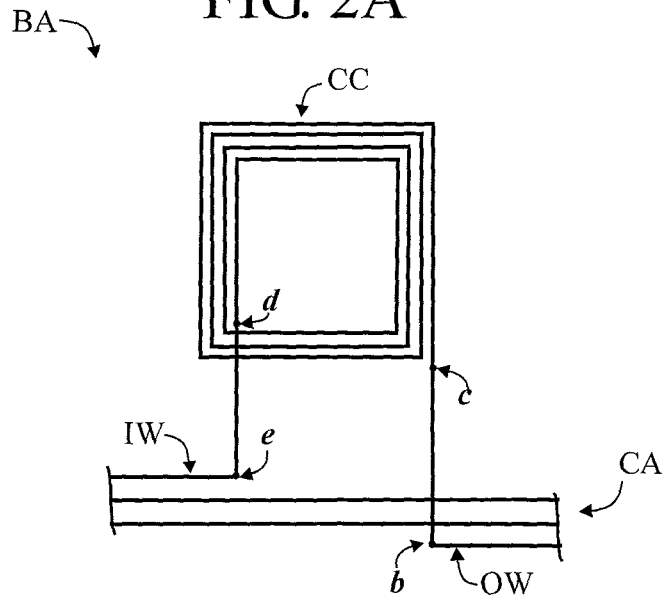
FIG. 2A is a diagram illustrating an arrangement of a coupler coil (CC) in relation to a card antenna (CA).

The outer end "b" of the outer winding OW may be connected with the inner end "e" of the inner winding IW, either directly (not shown, see FIG. 2A of U.S. Ser. No. 13/600,140) or via the intermediary of a coupler coil CC.

The inner end IE (a) of the outer winding OW and the outer end OE (f) of the inner winding IW may be left unconnected, as "free ends".

The overall booster antenna BA comprising outer winding OW, coupler coil CC and inner winding IE is an open circuit, and may be referred to as a "quasi-dipole"—the outer winding OW constituting one pole of the dipole, the inner winding IW constituting the other pole of the dipole—center fed by the coupler coil CC.

The coupler coil CC may be a long wire (or conductive trace) or conductive trace having two ends "c" and "d". The aforementioned U.S. Ser. No. 13/600,140 (US 20130075477), incorporated by reference herein discloses various configurations for laying and connecting the inner winding IW, outer winding OW and coupler coil CC. See, for example, FIGS. 3A-3D therein. The present invention is not limited to any particular one(s) of these configurations.

The coupler coil CC may be formed as a spiral having a number (such as approximately 10) of turns and having two ends "c" and "d". The end "c" may be an outer end OE or an inner end IE, the end "d" may be an inner end IE or an outer end OE, as described with respect to the embodiments shown in FIGS. 3A, 3B, 3C, 3D of US 20130075477. The coupler coil CC is disposed at an interior portion of the card body CB, away from the periphery, and is shown only generally with a few dashed lines in FIG. 2.

It should be understood that the booster antenna BA could be made with other than wire using additive processes such as printing conductive material onto the substrate CB, or subtractive processes such as etching conductive material away from the substrate CB. For such non-wire antennas, although there may be no actual direction such as is inherent with laying or embedding the wire (the course of laying the wire, from one end to the other), but the resulting spiral elements OW, IW, CC of the booster antenna BA may nevertheless exhibit a clockwise CW or counter-clockwise CCW "virtual sense" (or orientation) which can be determined by analogy to laying wire. (For an additive process such as inkjet printing, which is sequential, the sense would be actual.) The "sense" can be determined by following the pattern from "a" to "f", or from "f" to "a".

As used herein, "pitch" may refer to the average distance, center-to-center (c-c), between adjacent turns of a wire for a winding (OW, IW) or the coupler coil (CC), as it is being laid. (Or, by analogy, to the center-to-center distance between adjacent conductive tracks made by additive or subtractive processes). It should be understood that during manufacturing (including as a result of subsequent manufacturing steps such as laminating), the pitch of the wire may vary or change somewhat, such as +/−5%, or more. And, when going around a corner, such as in a rectangular spiral, the pitch may be somewhat indeterminate. It should also be understood that the pitch of the windings (OW, IW) or coupler coil (CC) may be advertently altered (typically increased) locally, such as at the free ends "a" and "f", to accommodate manufacturing processes (such as starting and ending embedding the wire) and the like. "Pitch" may refer to the initial (during laying) or final (after laminating) distance (c-c) between adjacent turns of a winding.

The outer winding OW, coupler coil CC and inner winding IW may be formed as one continuous structure, using conventional wire embedding techniques. It should be understood that references to the coupler coil CC being connected to ends of the outer winding (OW) and inner winding (IW) should not be construed to imply that coupler coil CC is a separate entity having ends. Rather, in the context of forming one continuous structure of outer winding OW, coupler coil CC and inner winding IW, "ends" may be interpreted to mean positions corresponding to what otherwise would be actual ends—the term "connected to" being interpreted as "contiguous with" in this context.

The inner winding IW may be disposed within the outer winding OW, as illustrated, on a given surface of the card body CB (or layer of a multi-layer inlay substrate). Alternatively, these two windings of the booster antenna BA may be disposed on opposite surfaces of the card body CB or on two different layers of the card body CB (see FIGS. 5F, 5G), substantially aligned with one another (in which case they would be "top" and "bottom" windings rather than "outer" and "inner" windings. The two windings of the booster antenna BA may be coupled in close proximity so that voltages induced in them may have opposite phase from one another. The coupler coil CC may be on the same surface of the card body CB as the outer and inner windings.

The turns of the outer winding OW and inner winding IW of the booster antenna BA may be at a pitch of 0.2 mm (200 μm), resulting in a space of approximately one wire diameter between adjacent turns of the outer winding OW or inner winding IW. The pitch of the turns of the coupler coil CC may be substantially the same as or less than (stated otherwise, not greater than) the pitch of turns of at least one of the outer winding OW and inner winding IW—for example 0.15 mm (150 μm), resulting in space smaller than one wire diameter between adjacent turns of the coupler coil (CC). Self-bonding copper wire may be used for the booster antenna BA. The pitch of both the outer/inner windings OW/IW and the coupler coil CC may both be approximately 2× (twice) the diameter of the wire (or width of the conductive traces or tracks), resulting in a spacing between adjacent turns of the spiral(s) on the order of 1 wire diameter (or trace width). The pitches of the outer winding OW and the inner winding IW may be substantially the same as one another, or they may be different than each other. The outer winding OW and inner winding IW may have the same sense (clockwise CW or counter-clockwise CCW) as each other.

It is within the scope of the invention that more turns of wire for the coupler coil CC can be accommodated in a given area—for example, by laying two "courses" of wire, one atop the other (with an insulating film therebetween, if necessary), in a laser-ablated trench defining the area for the turns of the coupler coil CC.

In FIG. 2, the coupler coil CC is shown without detail, represented by a few dashed lines. Some details of its construction, and how is my be connected with the outer winding OW and inner winding IW are set forth in FIGS. 3A-3D.

FIG. 2A (corresponding to FIG. 3A of US 20130075477) shows one example of a coupler coil CC which is laid by starting at a point "c", laying the coupler coil CC from outer turn to inner turn, in a counter-clockwise direction. When the inner winding is complete (point "d"), the wire crossesover the already laid turns. Other alternatives are starting at the an inner winding and continuing outward, and winding in different direction, winding the coupler coil CC in the same or opposite directions (sense) as the card antenna CA.

An antenna module AM may be mounted in on the card body CB so that its module antenna MA is closely adjacent the coupler coil CC, for coupling therewith. The antenna module AM may be disposed with its module antenna MA overlapping the coupler coil CC, or with its module antenna completely within the interior of the coupler coil CC, or with entirely within the coupler coil CC. The antenna module AM may be installed in a milled cavity on the card body CB so that its module antenna MA may be substantially coplanar with the coupler coil CC. The module antenna MA may be at a different level than (not coplanar with) the coupler coil CC.

The module antenna MA for the antenna module AM may also be a coil of wire wound with either a clockwise (CW) or counter-clockwise (CCW) sense. The module antenna MA may have the same sense (CW, or CCW) as the coupler coil CC. The module antenna MA may have the opposite sense (CW, or CCW) as the coupler coil CC. The module antenna MA may have the same sense (CW, or CCW) as the outer winding OW and/or the inner winding IW. The module antenna MA may have the opposite sense (CW, or CCW) as the outer winding OW and inner winding IW.

It may be noted that NL 9100347 (NEDAP; 1992) and U.S. Pat. No. 5,955,723 (Siemens; 1999) both describe 2 coils that are of a "given dimension". For example Coils 1 & 3—Coil 1 on the chip and Coil 3 on the card—and they also say they are concentric to each other and that allows the coupling. In the arrangements described herein, the coils (MA, CC) are not restricted to being the same size, nor are they restricted to being concentrically positioned.

In the course of laying the wire (or otherwise creating conductive paths for the antenna elements OW, CC, IW, using any of a variety of additive or subtractive processes) for the booster antenna BA, it is evident that the wire (or conductive path) may need to cross over itself at several positions. For a booster antenna BA comprising wire, the wire may be insulated, typically self-bonding wire. For conductive paths, appropriate insulating or passivation layers or films may be used to facilitate cross-overs.

Booster Antenna (BA) Components and Placement on the Card Body (CB)

Figure 3A:
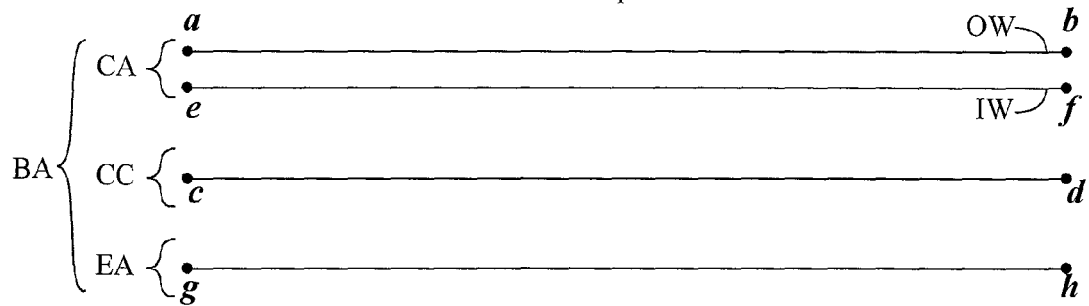
FIG. 3 is a diagram illustrating a card antenna (CA), coupler coil (CC) and extension antenna (EA) components of a booster antenna (BA).
FIG. 3B is a diagram illustrating various areas of a card body CB of a smart card.

FIG. 3A shows, schematically, some components of an exemplary booster antenna (BA)—namely:

- an exemplary card antenna CA may comprise a first winding OW having two ends "a" and "b" and a second winding IW having two ends "e" and "f", such as may have been described above.
- an exemplary coupler coil CC may have two ends "c" and "d", such as may have been described above
- the card antenna CA and coupler coil CC may be connected with one another in any suitable manner, such as may have been described above
- an antenna extension AE may be a long wire (or conductive trace) wire having two ends "g" and "h"—mounted to the card body CB in any suitable form such as (but not limited to) a spiral having a number of (at least one) turns, and may be disposed in the residual area (see 148, FIG. 1A) of the card body CB.
- the booster antenna BA components CA (OW, IW), CC and AE are illustrated as straight line segments, the dots at their two ends simply indicating an end position of the wire (or conductive trace), being included for graphic clarity.

Figure 3B:
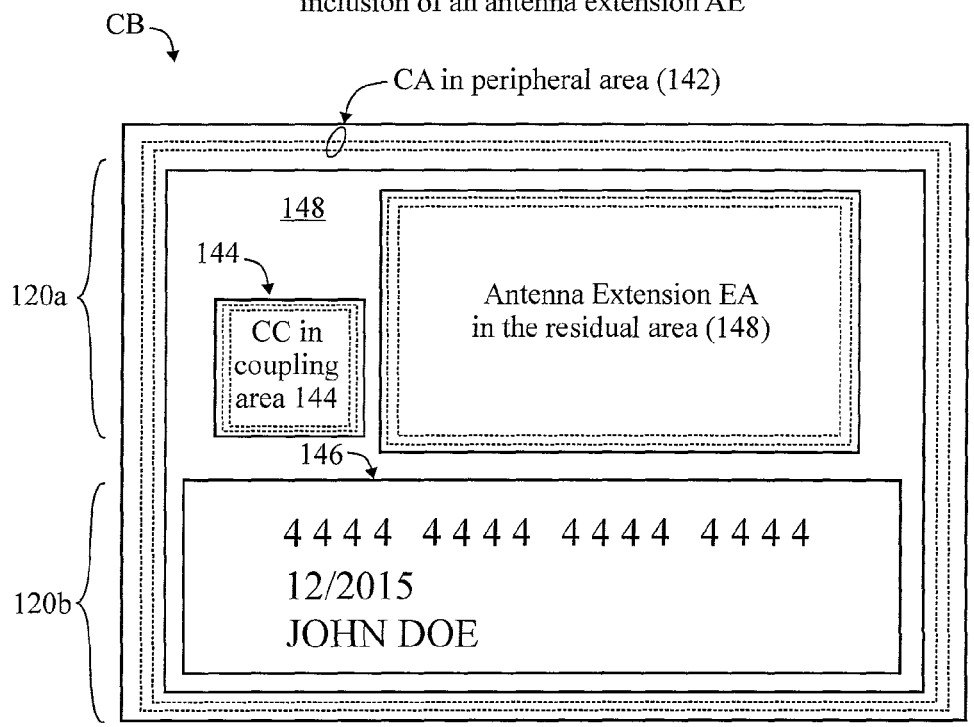

FIG. 3B expands upon FIG. 1A and illustrates, schematically and generally, the addition (inclusion) of an extension antenna EA component of a booster antenna BA disposed in the residual area (148) of a smart card. The extension antenna EA is shown only generally in this figure, it is shown in greater detail in other figures.

Some Configurations of Booster Antennas BA with Extension Antennas EA

Some configurations of booster antennas BA comprise card antennas CA which may be one winding or two windings (such as inner winding IW and outer winding OW), coupler coils CC (or coupler antennas) and extension antennas EA (or antenna extension, or extension coil, or extension loop). Each of the (CA, OW, IW, CC, EA) booster antenna components typically has two ends (see FIG. 3A), and typically has a plurality of windings (or turns). Both of the ends of a given antenna component may be connected to ends of other antenna components. Alternatively, one of the two ends of an antenna component may be a free end. Some of these components may be in the form of an open loop coil or a closed coil. An antenna component in the form of a "true" coil will exhibit a cross-over (see FIG. 4).

Figure 4:
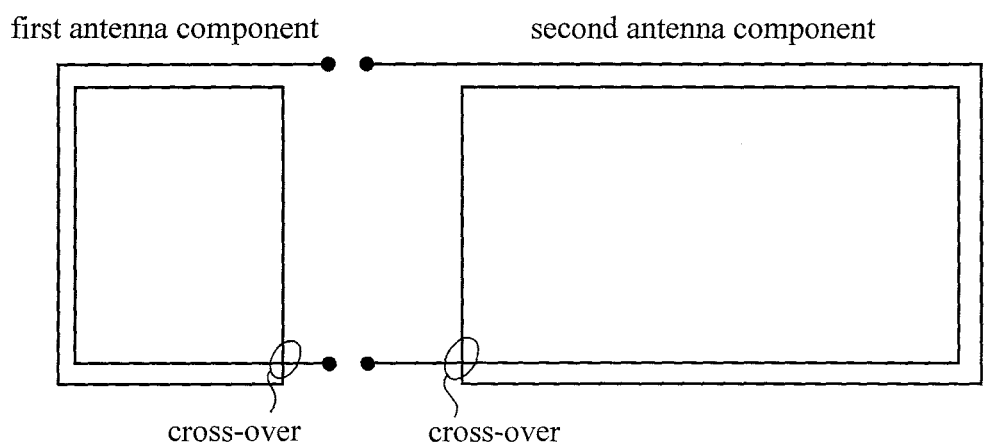
FIG. 4 is a diagram illustrating some antenna components, at least one of which is a "true" coil having a cross-over.

FIG. 4 is a diagram illustrating schematically some antenna components of a booster antenna (BA), at least one of which is a "true" coil having a cross-over. Generally, geometrically speaking, if a coil has at least one complete 360° turn, and is connected to another component that is disposed either outside of or inside of the coil—and there are no vias through the substrate (card body CB) for making connections from inside the coil to the outside thereof—it is inherently necessary that the pattern of the coil cross-over itself so that the two ends of the coil can connect with two terminals of the other component, as shown. In this figure, both of the components are true-coils. As used herein, a "true" coil may be defined as a coil, loop or spiral of wire (or other conductor) having two ends (such as "g" and "h"), extending at least approximately 360°, substantially enclosing an area (such as the coupling area 144), and crossing over itself (either from the outside in, or from the inside out).

U.S. 61/697,825 filed 7 Sep. 2012 discloses (FIG. 5H therein) a booster antenna BA comprising an inner winding IW and an outer winding OW (as disclosed herein, together the inner winding IW and outer winding OW may constitute a card antenna CA), an "open loop" coupler coil CC at the position of the antenna module AM, and an "extension" which may be referred to herein as an "antenna extension" or "extension antenna" or "extension coil" EA. See also U.S. Ser. No. 13/600,140 filed 30 Aug. 2012 (now US 20130075477 published Mar. 28, 2013, incorporated by reference herein.

Figure 4A:
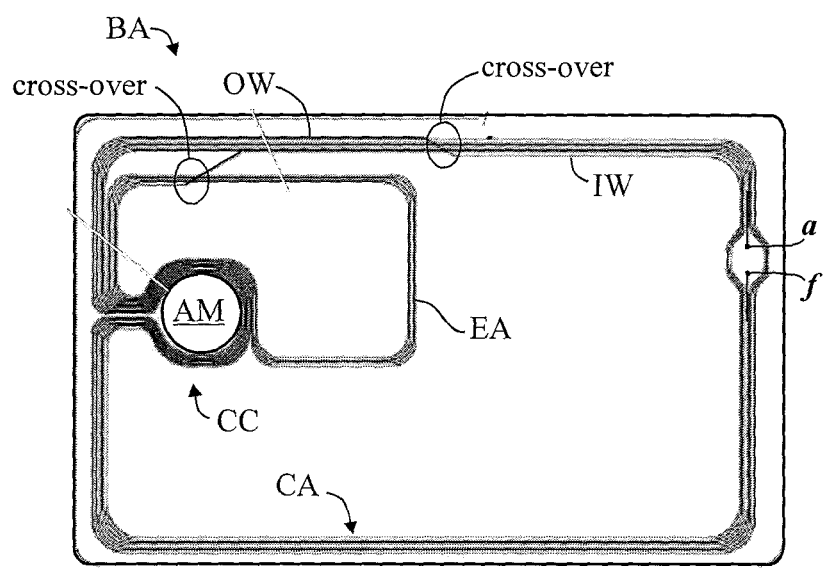
FIGS. 4A-4E are diagrams illustrating embodiments of a booster antenna (BA) with card antenna CA, a coupler antenna (CC) and an extension antenna (EA).

FIG. 4A is a diagram corresponding to FIG. 5H of U.S. Ser. No. 13/600,140, showing a booster antenna (BA) having a card antenna CA, a coupler coil CC and an extension antenna (EA). These components may be formed (embedded in the card body CB) as one continuous embedded coil. The coupler coil CC is in the form of an open loop ("horseshoe").

Note that both of the outer winding OW and inner winding IW are enlarged to form the coupler coil CC and substantially fully encircle the antenna module AM in the coupling area (144). The free ends (a, f) of the card antenna CA are shown disposed at the right edge of the card body CB.

The extension antenna EA has one end extending from an end of the coupler coil CC, and another end extending from an end of the card antenna CA, and exhibits a cross-over. The extension antenna EA (or extension coil, or extension loop) is disposed so as to have a portion adjacent two sides (or approximately 180°) of the coupler coil CC.

An antenna extension EA component is shown as an "extension" of the inner winding IW, comprising some turns of wire in a spiral pattern disposed near the antenna module AM in the left hand side of the top (as viewed) portion (120a) of the card body CB. The extension antenna EA may be disposed outside of, but near the coupling area (144) of the card body CB, in the residual area (148).

In this example, the coupler coil CC component of the booster antenna BA does not need to be a "true" coil, it does not need to have a cross-over. Rather, it may be a horseshoe-shaped "open" loop which substantially fully, but less than 360°, encircles the coupling area (144) for inductive coupling with the module antenna MA of the antenna module AM.

In this example, the card antenna CA is a true coil, in the form of a spiral extending around the peripheral area (142) of the card body CB, and exhibits a cross-over.

The extension antenna (or extension coil) EA has two ends—one end is connected to the coupler coil CC, the other end is connected to the card antenna CA. The extension antenna EA may be formed as a spiral of wire embedded in the card body CB, contiguous with one or more of the card antenna CA and coupler coil CC, and is a true coil which exhibits a cross-over, and contributes to the inductive coupling of the booster antenna BA. The extension antenna EA may be disposed in the residual area (148) of the card body CB, and is shown as being disposed only in the upper half (120a) of the card body CB, but it may extend to the lower half (120b) of the card body CB, including any or all of adjacent to, above, below or into the embossing area (146).

Figure 4B:
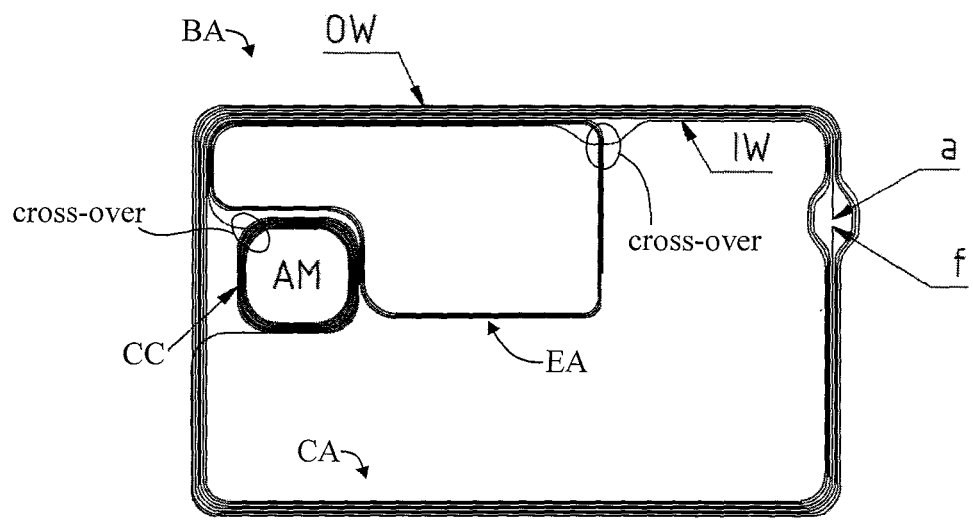

FIG. 4B is a diagram showing a booster antenna BA having a card antenna CA, a coupler coil CC and an extension antenna EA. These components may be formed (embedded in the card body CB) as one continuous embedded coil. The coupler coil CC is in the form of a closed loop, having a cross-over.

The extension antenna EA (or extension coil, or extension loop) has one end extending from an end of the coupler coil CC, and another end extending from an end of the card antenna CA, and exhibits a cross-over. The extension antenna EA is disposed so as to have a portion adjacent two sides (or approximately 180°) of the coupler coil CC.

In this example, the layout of the and inner winding (IW) and outer windings (OW) of the card antenna CA are slightly different than in FIG. 4A. The inner winding IW of the card antenna CA passes over the extension antenna EA at a different location than in FIG. 4A. In this example, the coupler coil CC forms a closed loop (rather than the horseshoe shown in FIG. 4A) around the antenna module AM, has a cross-over, and may therefore may be considered to be a "true" coil.

In this example, the extension coil EA is a true coil having a cross-over, is disposed in the residual area (148) of the card body CB, and is shown as being disposed only in the upper half (120a) of the card body CB, but it may extend to the lower half (120b) of the card body CB and into the embossing area (146). In this example, the extension antenna (EA) may occupy a larger area and have a narrower pitch (closer spacing of windings) than the extension antenna EA of FIG. 4A.

A benefit of having the extension antenna EA in a booster antenna BA may be to increase the inductivity of the booster antenna BA while reducing its resonance frequency. For example, without the extension antenna EA, the card antenna CA may require significantly more windings (such as in excess of 15 windings, instead of only 7 or 8 windings), depending on the spacing between the windings and the diameter or cross sectional area of the conductor of the wire used to form the booster antenna BA. It is within the scope of the invention that the card antenna CA has only one winding.

The booster antennas (BA) of FIGS. 4A and 4B both show card antennas CA having an inner winding (IW) and an outer winding (OW). Compare FIG. 2.

Figure 4C:
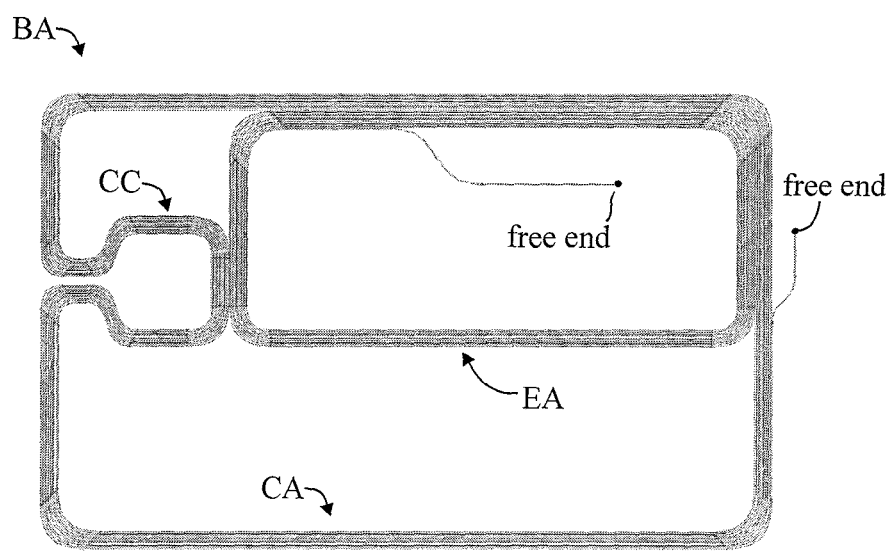

FIG. 4C is a diagram showing a booster antenna BA having a card antenna CA, a coupler coil CC and an extension antenna EA. These components may be formed (embedded in the card body CB) as one continuous embedded coil. The coupler coil CC is in the form of an open loop ("horseshoe").

The extension antenna EA (or extension coil, or extension loop) has one end extending from an end of the card antenna CA, its other end is a free end. The extension antenna EA is disposed so as to have a portion adjacent one side (or approximately 90°) of the coupler coil CC.

The card antenna CA may be a single coil (not having an inner winding IW and an outer winding OW as in some of the previous examples), having one free end.

The coupler coil CC may be a open loop, rather than a "true coil", and may be horseshoe-shaped, encircling most, but not all of the coupling area (144).

The extension antenna EA may be a continuation of an end of the card antenna CA, and may have one free end which is left unconnected. The extension antenna EA my be disposed to interact on one side of the coupler coil CC. The extension antenna EA may have several turns of wire, but does not need a cross-over.

Figure 4D:
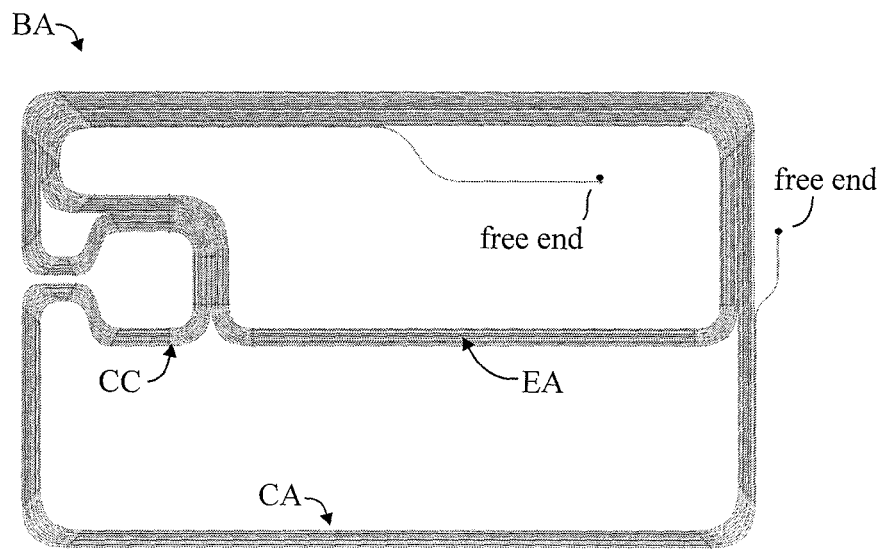

FIG. 4D is a diagram showing a booster antenna BA having a card antenna CA, a coupler coil CC and an extension antenna EA. These components may be formed (embedded in the card body CB) as one continuous embedded coil. The coupler coil CC is in the form of an open loop ("horseshoe").

The extension antenna EA (or extension coil, or extension loop) has one end extending from an end of the card antenna CA, its other end is a free end. The extension antenna EA is disposed so as to have a portion adjacent two sides (or approximately 180°) of the coupler coil CC.

In this example, the card antenna CA is one coil (does not have inner winding IW and outer winding OW as in some of the previous examples.) In this example, the coupler coil CC is not a "true coil", it is horseshoe-shaped and encircles most, but not all of the coupling area (144).

The extension antenna EA has one end which is an extension of the coupler coil CC, the other end is a free end. A free end makes possible the arrangement of a coil without a cross-over. In this example, the extension antenna (EA) is disposed to have portions adjacent two sides of the coupler antenna (CC).

In some of the booster antenna BA designs described herein, the card antenna CA component of the booster antenna BA may have a total of 12 windings (or turns)—for example, 6 windings each for the inner winding IW and outer winding OW, or a total of 12 for a simple card antenna CA. The extension antenna EA may have two functions, firstly to lower the resonance frequency of the booster antenna BA to the desired resonance of 13.56 MHz from approximately 18.00 MHz, for example with only 10 windings (wire diameter 80 to 112 µm and a pitch of 100 µm) in the antenna extension EA may reduce the resonance frequency by 5 MHz, and secondly to regulate or concentrate the electromagnetic field when in close coupling proximity to the external contactless reader (see FIG. 1) at around 20 mm.

The ability to reduce the number of windings required in the card antenna CA may enhance the performance and manufacturability of the smart card. More windings makes the card stiffer, and there is not a lot of room in the peripheral area (142) of the card body CB, particularly below the embossing area (146) to accommodate very many turns of wire.

A "coupling area" (144) may be defined as the area immediately under the antenna module AM (and its module antenna (MA)). The coupler coil CC may be typically located in the coupling area. The extension antennas EA may be disposed in other than the coupling area, as discussed above, but nevertheless may enhance the overall coupling between the booster antenna BA and the module antenna MA, and/or the booster antenna BA and the antenna of an external reader.

In FIGS. 4C and 4D, the one end of the extension antenna EA may be connected with the coupler coil CC, rather than with the card antenna CA.

FIGS. 4C and 4D illustrate how the shape and position of the extension antenna EA may be varied, with respect to the card antenna CA and coupler antenna CC, in order to tune the RF characteristics of the booster antenna BA. FIG. 4C shows a design where the extension antenna EA may be disposed along only one side of the coupler coil CC, or coupler antenna) and two sides of the card antenna CA. FIG. 4D shows the extension antenna EA disposed adjacent two sides of the coupler antenna (CC) and two sides of the card antenna CA.

A number of benefits may be attributable to the use of an extension antenna EA as a component of a booster antenna BA. Some variations of the extension antenna EA include how it is disposed with respect to the coupler coil CC component, as well as how it is disposed with respect to the card antenna CA component. The extension antenna EA may be a true coil, connected at at least one of its two ends to one or both of the coupler coil CC and card antenna CA. Its other end may also be connected to one or both of the coupler coil CC and card antenna CA, or may remain as a free end.

Figure 4E:
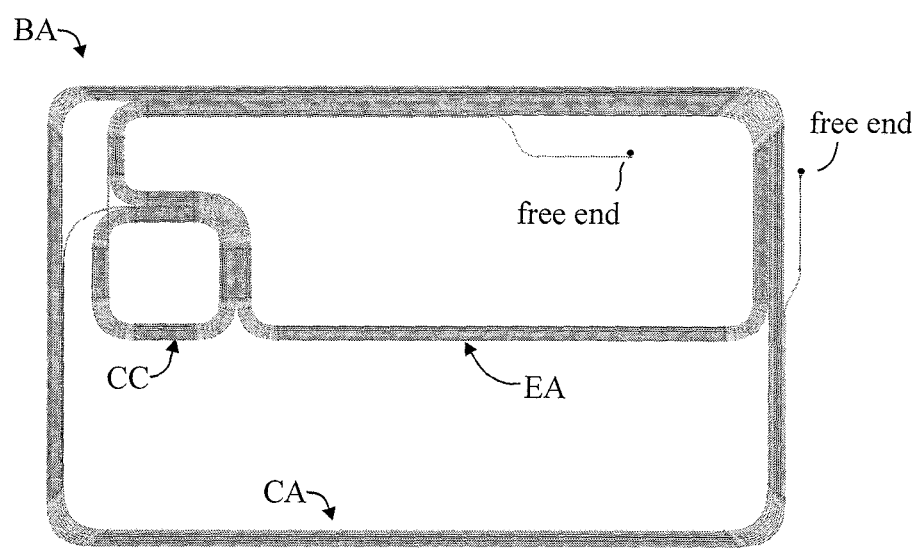

FIG. 4E is a diagram showing a booster antenna BA having a card antenna CA, a coupler coil CC and an extension antenna EA. These components may be formed (embedded in the card body CB) as one continuous embedded coil. The coupler coil CC is in the form of a closed loop.

The extension antenna EA (or extension coil, or extension loop) has one end extending from an end of the coupler coil CC, its other end is a free end. The extension antenna EA is disposed so as to have a portion adjacent two sides (or approximately 180°) of the coupler coil CC.

The card antenna CA may comprise one coil (without an inner winding IW and an outer winding OW as in some of the previous examples), and may have a free end. In this example, the coupler coil CC is a true coil, and has a cross-over.

This design features a low number of turns at the perimeter of the card body CB below the embossing area (or "5$^{th}$ line" of embossing). The extension antenna (EA) may be disposed to have portions adjacent two sides of the coupler antenna (CC), and may have a free end.

In this example, the extension antenna EA have one end extending from the coupler coil CC and its other end may be a free end. The extension antenna EA may be disposed along two sides of the coupler antenna (CC).

Booster Antenna BA Components Disposed Primarily in the Top Half of the Card Body CB Reference is made to U.S. Ser. No. 13/600,140 filed 30 Aug. 2012 (now US 20130075477), particularly FIGS. 6A,B,C thereof, and also to U.S. 61/697,825 filed 7 Sep. 2012, particularly FIG. 6D thereof, all of which are incorporated by reference herein.

Figure 4F:
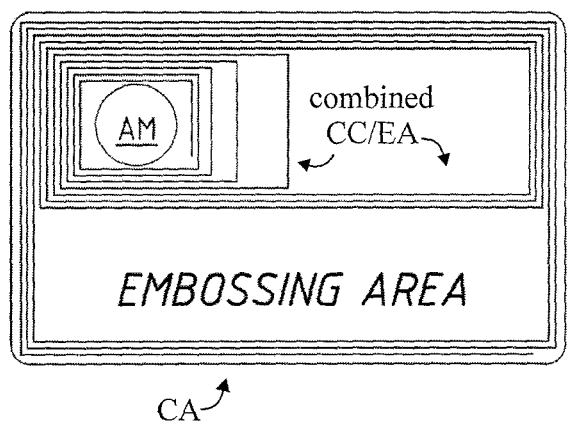
FIGS. 4F-4I are diagrams illustrating embodiments of a booster antenna (BA) with card antenna CA, a coupler antenna (CC) and an extension antenna (EA).

FIG. 4F shows that the booster antenna BA may extend around the peripheral area (142) of the card body CB, and also into the coupling area (144) and the residual area (148), while avoiding the embossing area (146). In this example, the coupler coil CC and extension antenna EA are essentially combined with one another, as a coil wherein the turns increase in pitch as the combined CC/EA booster antenna component extends across the residual area.

There is no true center to the coil formed by the combined coupler coil CC and extension antenna EA components, and the antenna module AM is positioned asymmetrically with respect to the combined CC/EA antenna component, and the degree of asymmetry can be varied by varying the pitch of the turns within the extension antenna (EA) in the area above the embossing area.

Figure 4G:
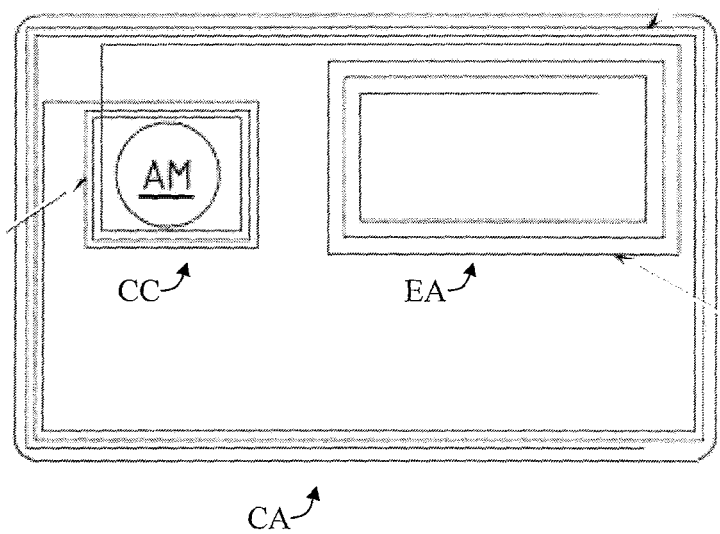

FIG. 4G is a diagram showing a booster antenna (BA) having a card antenna CA, a coupler coil CC and an extension antenna (EA). These components may be formed (embedded in the card body CB) as one continuous embedded coil.

The extension antenna EA has one end connected with an end of the coupler coil CC, its other end is a free end. The pitch (spacing between turns) of the extension antenna EA may be different than the pitch of the coupler coil CC. Both the extension antenna EA and coupler coil CC may have pitches different than that of the card antenna CA.

The coupler coil CC is shown as a "true" coil (closed loop), having a crossover. The extension antenna EA may be connected at one end to one end of the coupler coil CC, the other end of the extension antenna EA may be a free end (not connected to another booster antenna BA component. The extension antenna EA may not have a cross-over. The extension antenna EA may have a pitch (spacing between adjacent turns) which is different than that of the coupler coil CC, and the pitch can be selected in order to vary the capacitance of the extension antenna (EA) and hence tune the resonance frequency of the booster antenna (BA). The components of the booster antenna (BA) may be formed as a continuous wire embedded coil.

Figure 4H:
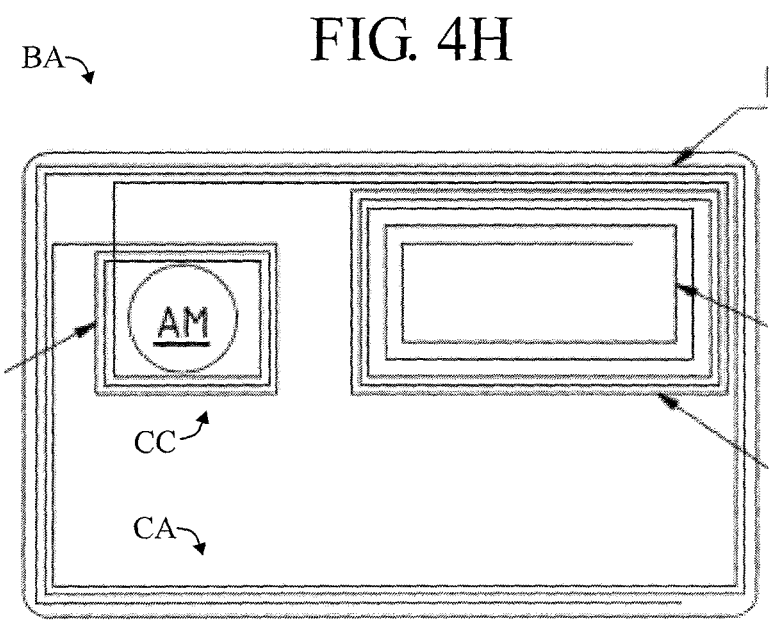

FIG. 4H is a diagram showing a booster antenna (BA) having a card antenna CA, a coupler coil CC and an extension antenna (EA). These components may be formed (embedded in the card body CB) as one continuous embedded coil.

The extension antenna EA has one end connected with an end of the coupler coil CC, its other end is a free end. The pitch (spacing between turns) of the extension antenna EA may be formed with varying pitches—for example, increasing in pitch towards its inner turns (versus its outer turns), for example a narrow pitch at the outer turns and a wider pitch at the inner turns of the extension antenna EA. The pitch of individual turns of the extension antenna EA may be adjusted to match the booster antenna (BA) resonance frequency.

Figure 4I:
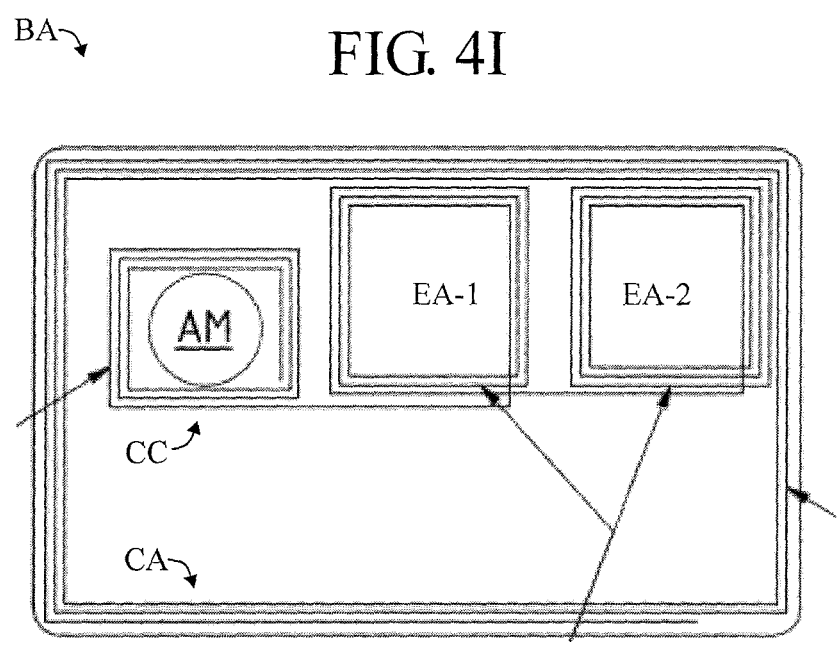

FIG. 4I is an illustration of a booster antenna (BA) with card antenna CA, a coupler antenna (CC) and an extension antenna (EA). The antenna may be laid on the card body CB as a continuous embedded coil.

The extension antenna EA comprises two coils EA-1 and EA-2 which may be connected in series with one another, as shown. One end of the coil EA-1 is connected with an end of the coupler coil CC, the other end of the coupler coil CC may be a free end. The other end of the coil EA-1 is connected with a first end of the coil EA-2. The other end of the coil EA-2 is connected with an end of the card antenna CA, the other end of the card antenna CA may be a free end. The two coils EA-1 and EA-2 of the extension antenna EA may be laid with the same sense (both clockwise), or with opposite senses (one clockwise, the other counter clockwise).

This concept can be applied to more than two extension antennas (EAs). The two or more extension antennas (EAs) may have independently different sizes, shapes, pitch and number of turns, and each one may have a varying (increasing or decreasing) pitch. The use of multiple extension antennas (EAs) allows for flexibility in the design of the extension antenna (EA) system in order to tune, including adjusting at least one of the inductance and the resonance frequency, of the booster antenna (BA). The use of multiple extension antennas (EAs) can ultimately improve the coupling between the booster antenna (BA) and the module antenna (MA).

In the various embodiments disclosed herein, the booster antenna BA may be a continuous embedded coil(s) of wire. All of the antenna components may be formed from a single continuous length of wire. Some of the components, or some portions thereof may be formed from conductive tracks other than wire, such as by additive (e.g., printing) or subtractive (e.g., etching) processes.

Some Additional Configurations of the Coupler Coil (CC)

Figure 5A:
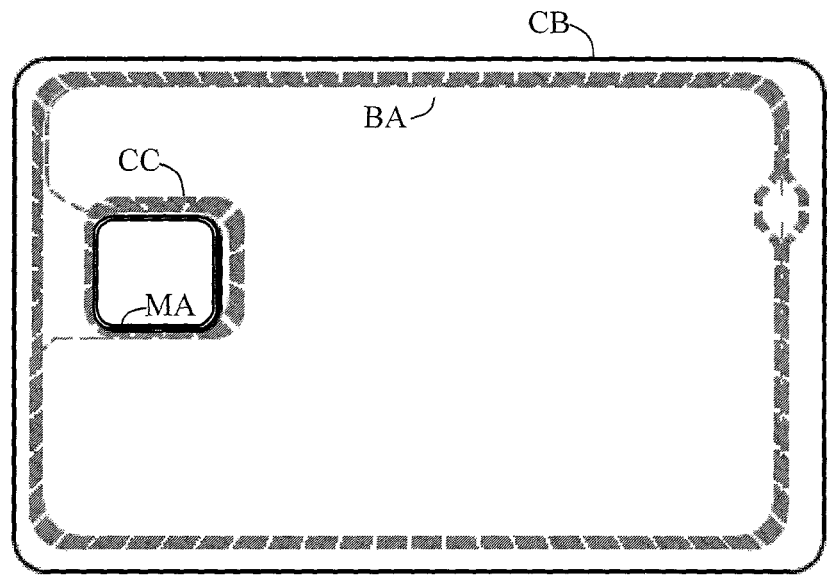
FIG. 5A is an illustration of a booster antenna (BA) with its coupler antenna (CC) disposed slightly off-center from the module antenna (MA) of an antenna module (AM).

FIG. 5A shows a booster antenna BA with a coupler coil CC. Details such as outer winding OW and inner winding IW of the booster antenna BA are omitted, for illustrative clarity. An antenna module AM with module antenna MA may be mounted in the card body CB (not shown), as described above.

Here it can be observed that the middle of the antenna module AM, which may be nominally (typically) coincident with the center of the module antenna MA, is offset noticeably from (substantially non-coincident with) the middle (center) of the coupler coil CC.

The offset between the center of the module antenna MA from the center of the coupler coil CC need not be great to avoid any implication that they are substantially coincident (substantially concentric). First of all, the antenna module AM and its module antenna MA measure only approximately 8 mm-10 mm on a side (square). One millimeter is a significant offset on this scale. Furthermore, whereas U.S. Pat. No. 5,955,723 (Siemens, 1999) is adamant that the coupler coil (third loop) and module antenna (first loop) must be disposed "substantially concentrically", better coupling may be achieved by having the offset shown in FIG. 5A. And the offset may facilitate overlapping of the module antenna MA with one or two sides of the coupler coil CC, for increased coupling therebetween. In FIG. 5A it may be observed that the module antenna MA overlaps the bottom and left sides of the coupler coil CC. (The module antenna MA and coupler coil CC are both somewhat rectangular, each having four sides.)

Figure 5B:
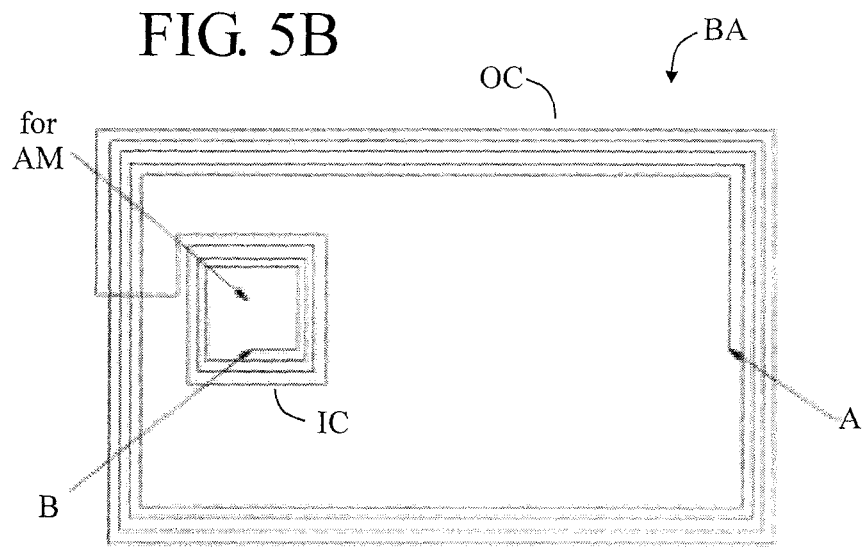
FIG. 5B is an illustration of a booster antenna (BA) with a coupler coil (CC) having a free end.

FIG. 5B is an illustration of a booster antenna (BA) with a coupler coil (CC) having a free end, and shows a booster antenna BA having an card antenna CA (peripheral portion) which may be referred to as an "outer coil" OC and a coupler coil CC (coupler portion) which may be referred to as an inner coil IC defines a coupling area for the antenna module AM (not shown). Overall, there are only two free ends—an end "A" of the outer coil OC, and an end "B" of the inner coil IC.

The outer coil OC is shown being laid from its end "A" counterclockwise CCW, from inner turn to outer turn, then after approximately 10 turns, heading inward to start laying the inner coil IC. The inner coil IC is shown being laid clockwise (CW), from an outer turn to an inner turn, then after approximately 20 turns ending at the point "B".

The sense CW of the inner coil IC is shown opposite from the sense CCW of the outer coil OC. They may, however, have the same sense.

The outer coil OC is shown being laid from innermost to outermost turn. Alternatively, it may be laid from outermost turn to innermost turn.

The inner coil IC is shown being laid from outermost turn to innermost turn. Alternatively, it may be laid from innermost turn to outermost turn.

The pitches for the inner coil IC and outer coil OC may be the same, or different than one another. The pitches for each of the inner coil IC and outer coil OC may be non-uniform, including progressive, such as increasing from turn-to-turn from inner to outer turns of the respective coil.

Figure 5C:
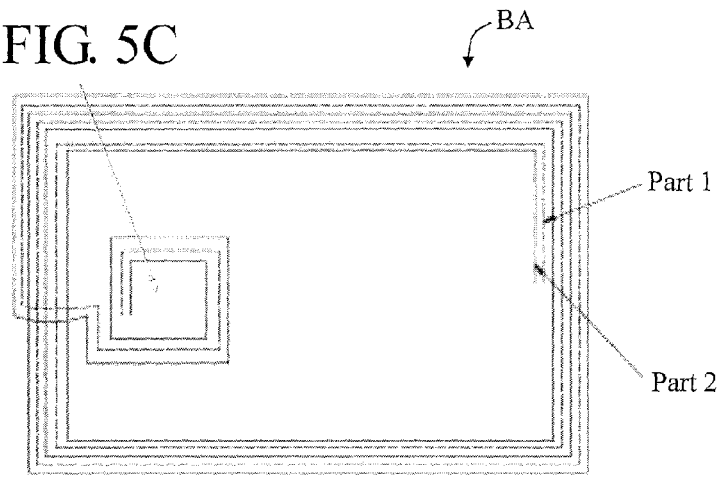
FIG. 5C is an illustration of a booster antenna (BA) with a coupler coil (CC) which is formed as an extension of windings of the card antenna (CA).

FIG. 5C shows a booster antenna BA having two windings or parts, designated "Part 1" and "Part 2". Each of these parts has two free ends, and has an outer peripheral portion and an inner coupling portion.

The outer peripheral portion of each part may be laid from its end, counterclockwise CCW, from an inner turn to an outer turn, then after approximately 5 turns, thereafter heading inward to start laying the inner portion. The inner portions are shown being laid also counterclockwise CCW, from an outer turn to an inner turn, then after approximately 10 turns ending at the point "B". The number of turns is merely illustrative, and the senses can be reversed.

The two parts—Part 1 and Part 2—may be realized interleaved (as illustrated) on the same surface of a substrate (card body CB), or on opposite sides of the substrate, or on two layers of a multi-layer substrate. The two parts may be substantially identical with one another.

Figure 5D:
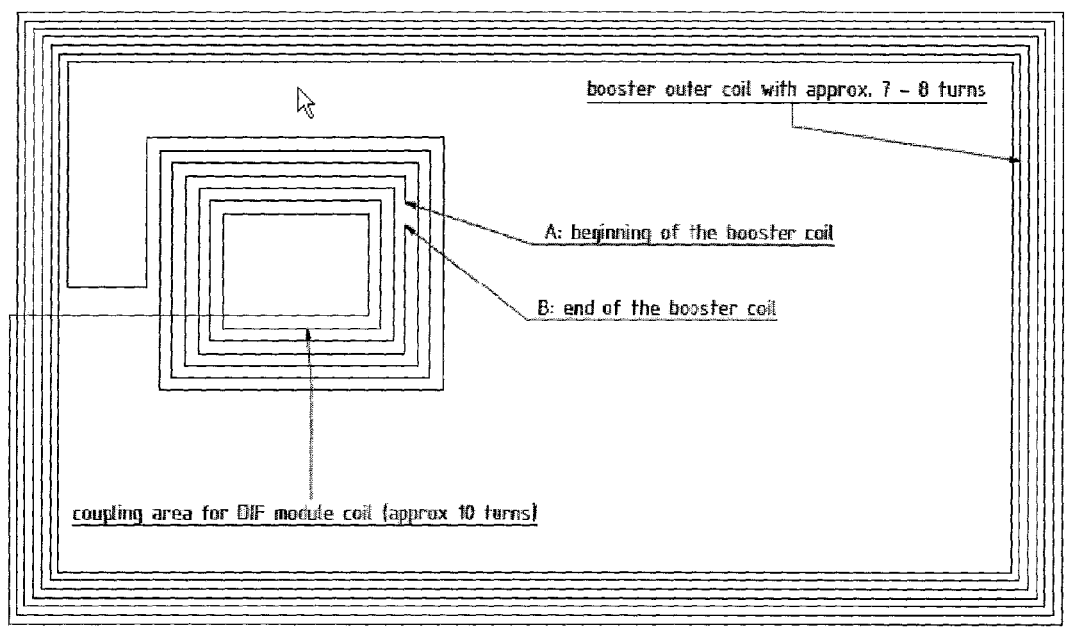
FIG. 5D is an illustration of a booster antenna (BA) with a coupler coil (CC) having two free ends within the coil.

FIG. 5D shows that a peripheral portion of the booster antenna BA may have no free ends (it is continuous), and the coupler coil CC may have two free ends. This configuration may be laid starting at point A, at an interior turn of the coupler coil CC, proceeding counterclockwise CCW and outward to an outer turn of the coupler coil CC, moving towards the periphery of the card body CB and proceeding clockwise CW, laying the peripheral portion of the booster antenna BA from inside turn to outside turn, then returning to the interior of the card body CB to complete laying the coupler coil CC from an inner turn, proceeding counterclockwise CCW to the interior turn and ending at a point B on the interior turn (which may be the same interior turn as point A). Points A and B are the two free ends of the single wire (or conductive track) forming the booster antenna BA. The outer portion may comprise approximately 7-8 turns, the inner portion may comprise approximately 10 turns.

Other alternative designs are possible. For example, connecting ends of the module antenna MA to a portion or end of the booster antenna BA or coupler coil CC (or similar portion of a booster antenna BA.

A "Folded" Coupler Coil

U.S. 61/841,286 filed 29 Jun. 2013 (Finn, Czornack) discloses a "folded" coupler coil. See FIGS. 5A, 5B therein.

Figure 5E:
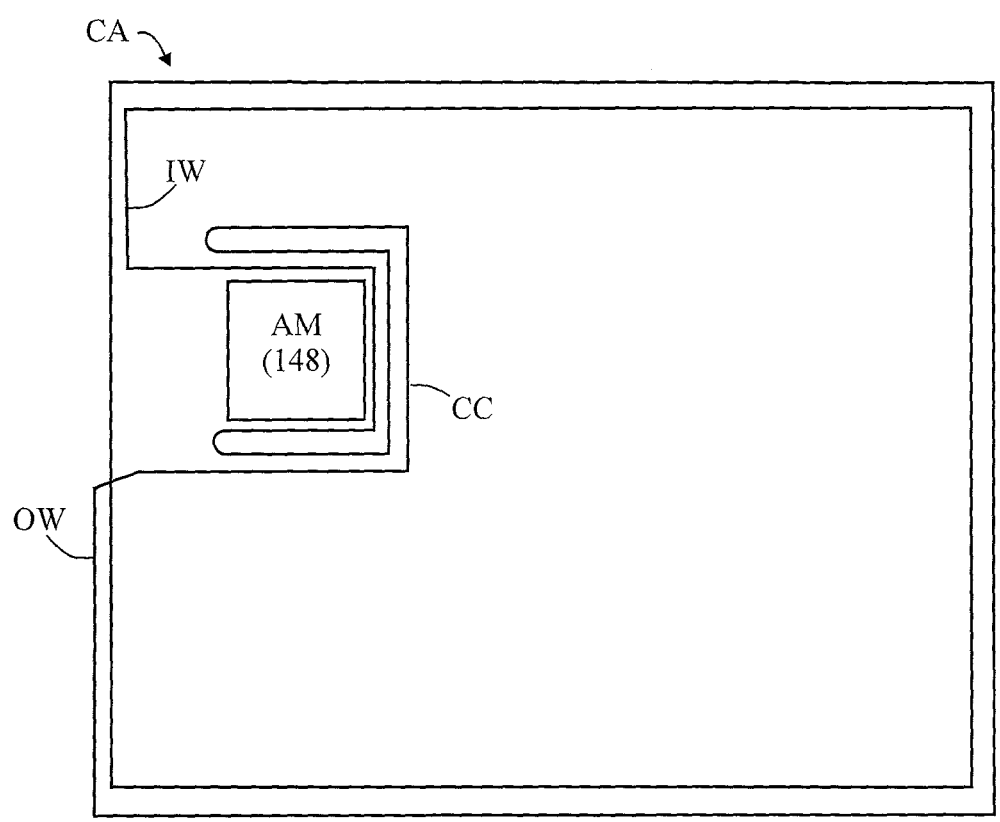
FIG. 5E is a diagram illustrating a "folded" coupler coil CC.

FIG. 5E shows a booster antenna BA and its coupler coil component CC. The coupler coil CC in this example has two ends, several windings, and may be formed by embedding a wire nearly all (such as approximately three-quarters of the way of the way around a coupling area (144), the reversing direction and going back to the starting position, then reversing position and again going three-quarters of the way around the coupling area, and so forth.

The card antenna CA of the booster antenna BA is shown having only a few turns, for illustrative clarity, and exhibits a cross-over. The coupler coil CC is shown without a cross-over, one end of the coupler coil CC being connected to an inner winding of the card antenna CA, the other end of the coupler coil CC being connected to an outer winding of the card antenna CA.

A Compound Booster Antenna (BA)

FIGS. 5F,G,H illustrate forming two booster antennas, each having a partial coupler coil, in two different planes, such as one booster antenna on each of two opposite sides of the card body (substrate), or on two separate layers which may then be laminated together.

FIG. 5I shows that a first booster antenna BA-1 may be formed on one side of the card body CB with its coupler coil component CC-1 encircling the top half (approximately 180°) of the antenna module AM. FIG. 5J shows that a second booster antenna BA-2 may be formed on the opposite side of the card body CB with its coupler coil component CC-2 encircling the bottom half (approximately 180°) of the antenna module AM.

Each of the booster antennas BA-1, BA-2 may comprise a outer winding OW and inner winding IW, and may have two free ends "a" and "f". The free ends (a, f) of the booster antennas BA-1, BA-2 are shown towards the bottom of the right edge of the card body CB.

FIGS. 5F and 5G show an embossing area (in dashed lines) on the bottom portion of the card body CB, which is an area "reserved" for embossing, in which the booster antennas BA-1 and BA-2 should not encroach. They may however pass along (just inside of) the bottom edge of the card body CB.

FIG. 5H shows that in combination with one another, the two booster antennas BA-1 and BA-2 provide full enclosure (approximately 360°) of the antenna module AM. In FIG. 5K, the card body (CB) and antenna module (AM) are omitted, for illustrative clarity. The two booster antennas BA-1 and BA-2 may constitute what may be referred to as a "composite booster antenna".

It should be understood that in various ones of the configurations for booster antennas shown herein that booster antennas other than FIG. 2 type quasi-dipole (Q-D) booster antenna (BA) may be employed to achieve the desired enclosure of the antenna module AM and consequent improvements to coupling between the module antenna and the booster antenna.

Some Additional Arrangements of a Booster Antenna (BA)

In the following embodiments, the antenna module (AM) is disposed on the upper portion of the card body (CB) of a smart card, in a conventional manner, and the booster antenna (BA) is also disposed primarily (substantially, including fully) on the upper portion of the card body (CB). The lower portion (Embossing Area) of the card body CB is "reserved" for embossing, and other than a small area at the perimeter is generally not available for a booster antenna.

Figure 6A:
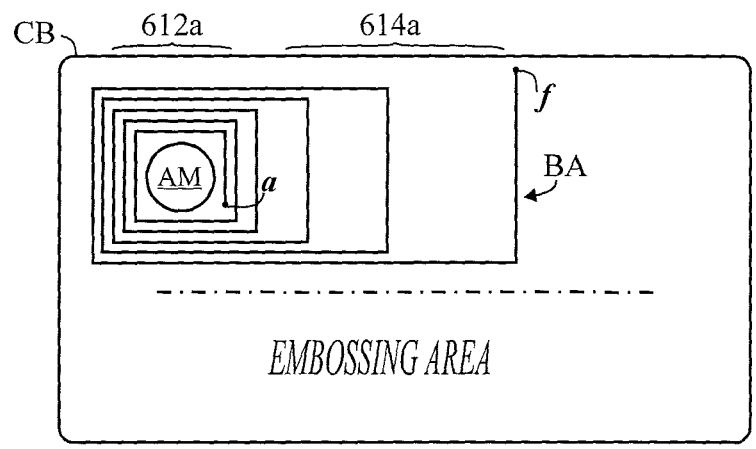
FIGS. 6A,B,C,D are diagrams (plan view) of additional configurations for booster antennas (BA), disposed primarily in the top half of the card body (CB).

FIG. 6A (similar to FIG. 4F) illustrates a smart card having a card body CB, an antenna module AM disposed in the upper portion of the card body CB. A booster antenna BA is generally in the form of a rectangular spiral of wire (or other conductive material), having two free ends "a" and "f". Only a representative few turns of the booster antenna BA are illustrated.

A portion 612*a* of the booster antenna BA is closely spiraled around the antenna module AM in the manner of the coupler coils (CC) described hereinabove with respect to FIGS. 3, 3A-3D. This "coupler portion" 612*a* of the booster antenna BA may have a relatively small pitch. Although the coupler portion 612*a* is shown as being at one end portion of the overall booster antenna BA, it may be created at an portion, such as a midsection of the booster antenna BA.

A remaining portion 614*a* of the booster antenna BA has a pitch that may increase across the width of the card body. The general idea is that the booster antenna BA may cover substantially the entire width of the card body. Since the width of the card body is greater than its height, even more so when comparing the width of the card body with the height of the upper portion only, there is more room in the width dimension for the turns of the booster antenna to spread out, and this area may be advantageously utilized.

If the coupler portion 612*a* were formed at a midsection of the overall booster antenna BA (rather than at one end, as shown), the remaining portion 614*a* of the booster antenna would have two portions (or "poles") extending from the coupler portion 612*a*, forming a kind of dipole antenna. This would be analogous to the FIG. 3 type booster antenna, described as a "quasi-dipole" which has an outer winding OW and an inner winding IW extending from a more-or-less central coupler coil CC.

Figure 6B:
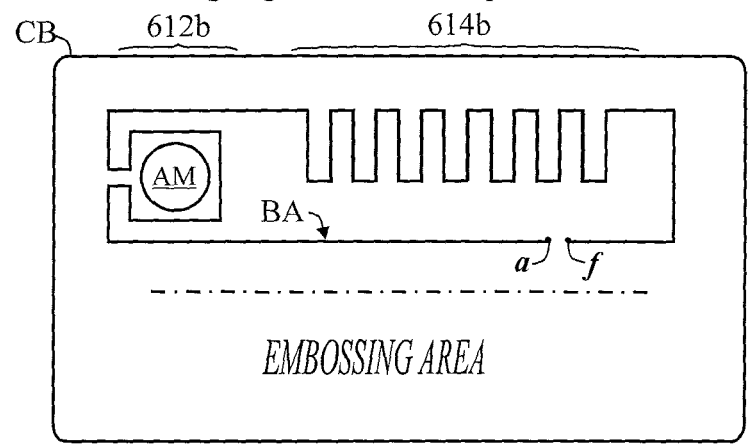

FIG. 6B illustrates a smart card having a card body CB, an antenna module AM disposed in the upper portion of the card body CB. A booster antenna BA is generally in the form of a rectangular loop of wire (or other conductive material), having two free ends "a" and "f". Only a representative few turns of the booster antenna BA are illustrated.

A portion 612*b* of the booster antenna BA, which may be referred to as a "coupler portion", is closely spiraled around the antenna module AM in the manner of the coupler coils (CC) described hereinabove with respect to FIGS. 3, 3A-3D.

A remaining portion 614*b* of the booster antenna BA extends across the width of the card body, and includes a portion which is formed with a zig-zag, for improved capacitance. This remaining portion 614 may exhibit a spiral pattern.

In the embodiments of FIGS. 6A and 6B, the booster antenna BA is illustrated disposed entirely within the upper portion of the card body CB, not encroaching on the lower embossing area. However, it is evident that the ends "a" and "f" of the booster antenna(s) could extend into the embossing area.

Figure 6C:
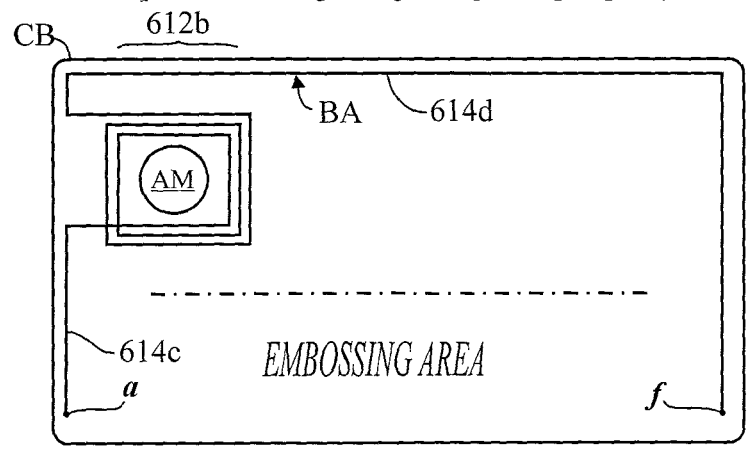

FIG. 6C illustrates a smart card having a card body CB, an antenna module AM disposed in the upper portion of the card body CB. A booster antenna BA is generally in the form of a rectangular loop of wire (or other conductive material), having two free ends "a" and "f". Only a representative few turns of the booster antenna BA are illustrated.

A portion 612*c* of the booster antenna BA, which may be referred to as a "coupler portion", is closely spiraled around the antenna module AM in the manner of the coupler coils (CC) described hereinabove with respect to FIGS. 3, 3A-3D.

In this example, the coupler portion 612*c* is shown formed at a midsection of the overall booster antenna BA (rather than at one end, as shown), and there are two remaining portions 614*c*, 614*d* of the booster antenna BA extending from the coupler portion 612*c*, forming a kind of dipole antenna. This is somewhat analogous to the FIG. 2 type booster antenna, described as a "quasi-dipole" which has an outer winding OW and an inner winding IW extending from a more-or-less central coupler coil CC.

The remaining portion 614*c* extends from one end of the coupler portion 612*c* along a side edge (left side, as viewed) of the card body CB into the embossing area. (This is acceptable to have a portion of the booster antenna BA in a peripheral region only of the embossing area.)

The remaining portion 614*d* extends from the other end of the coupler portion 612*c* along the top edge of the card body CB to the right (as viewed) side edge thereof, thereafter extending down the right edge of the card body CB into the embossing area.

The booster antenna BA with remaining portions 614*c* and 614*d* extending from the two ends of the coupler portion 612*c*) forms a kind of dipole antenna which is somewhat analogous to the FIG. 2 type booster antenna.

Figure 6D:
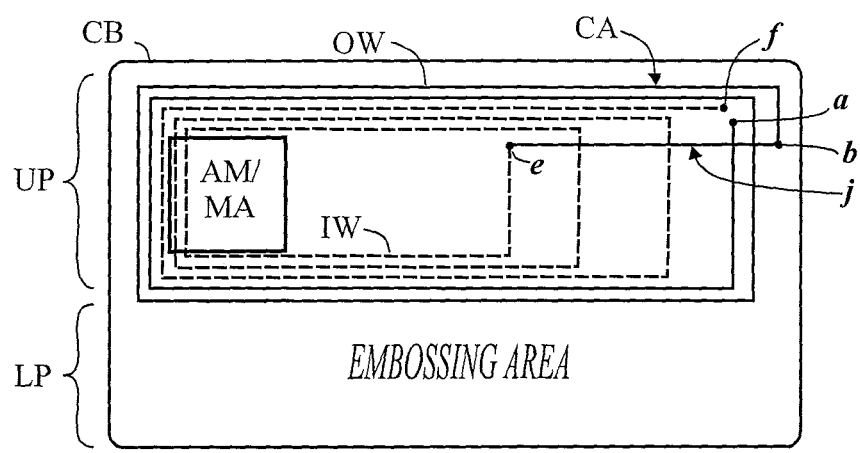

FIG. 6D shows a configuration for a card antenna CA having an outer winding OW and an inner winding IW. The card antennas described hereinabove occupy substantially the entire peripheral portion of the card body CB, the card antenna CA is disposed within and near all four (top, right, left, bottom) edges of the card body CB. In contrast therewith, the card antenna CA of FIG. 8 occupies only approximately the top half of the surface of the card body CB, leaving the bottom half of the card body CB free for embossing, etc. In other words, the card antenna CA of FIG. 8 may extend along substantially all of the top side edge of the card body CB, only about halfway down the right and left side edges of the card body, and across a central portion of the card body. The overall area encompassed by the card antenna CA is only about half of the overall area of the card body CB.

The card antenna CA may be configured as quasi-dipole with inner and outer windings (IW/OW), the outer end "b" of OW connected via jumper "j" to inner end "e" of IW, the inner end "a" of OW and outer end "f" of IW are free ends.

The module antenna MA of antenna module AM may overlap only a portion of the inner winding IW. There is no distinct coupler coil CC. The "center" of any given windings of the OW and IW of the card antenna CA is outside of the area of the antenna module AM The pitch of the turns of the outer winding OW and/or inner winding IW may vary (such as increase) across the width of the card body CB, as illustrated.

Some Characteristics of the Booster Antenna and its Components

The booster antenna BA and its various components may be formed of various size wire ranging, for example, from approximately 50 µm to 112 µm in diameter. A single continuous wire may be modified, such as with a conductive coating to have different diameters for different ones of the booster antenna components. Flat wire can also be used, and may be beneficial for booster antenna components which may extend into the embossing area (146). Wires having different resistances, or a single continuous wire having portions with different resistances may be used for the various components of the booster antenna.

The number of turns and the spacing of the turns of the booster antenna BA and its various components may be varied to control characteristics of the booster antenna BA and its performance.

Distinguishing Over Some of the Prior Art

U.S. Pat. No. 5,955,723 (Siemens; 1999), incorporated by reference herein, discloses a contactless chip card having a first conductor loop connected to the semiconductor chip and at least one second conductor loop with approximately the dimensions of the data carrier, and a region forming a third loop with approximately the dimensions of the first conductor loop. Inductive coupling is described.

In the Siemens patent, there is no disclosure of an additional antenna extension (EA), nor is there any disclosure of the conductor loops (comparable to the "booster antenna" BA described herein) components extending into the embossing area (146) or into the residual area (148) (or embossing are) of a card body (CB), as disclosed herein.

U.S. Pat. No. 8,130,166 (Assa Abloy; 2012), incorporated by reference herein, discloses a coupling device is formed by a continuous conductive path having a central section in the form of a small spiral and two extremity sections which are formed as large spirals. The pitches of the large spirals are chosen such that the large spirals have mainly a capacitive behavior. The pitch of the small spiral is chosen such that the small spiral has mainly an inductive behavior.

In the Assa Abloy patent, the large spirals appear to be in the peripheral area (142), and the small spiral appears to be in the coupling area (144). There is no disclosure of an additional antenna extension (EA), nor is there any disclosure of the coupling device (comparable to the "booster antenna" BA described herein) components (small and large spirals) extending into the embossing area (146) or into the residual area (148) (or embossing are) of a card body (CB), as disclosed herein.

US 20130146671 (Infineon; 2013), incorporated by reference herein, discloses a booster antenna structure for a chip card, which may include an additional electrically conductive structure connected to the booster antenna. The additional electrically conductive structures disclosed therein are principally capacitive structures. FIG. 11A (for example) shows a booster antenna structure with a finger capacitor. FIG. 12A (for example) shows a booster antenna structure with a spiral capacitor. FIG. 12B (for example) shows a booster antenna structure with a dummy turn as capacitor. FIG. 13A shows a meander shape. The structures which form the capacitor, and the booster antenna structure, may be arranged in the same plane. In this case, no additional structural layer is required in which one of the components is arranged separately, but both the structures forming the capacitor and the booster antenna structure may be formed in a forming process on the same layer, i.e. in the same plane, that is to say, for example, on one or on two sides of the carrier on which the booster antenna structure is arranged. The capacitor may also be configured as line capacitor and arranged, for example, as dummy turn. The dummy turn may have two conductor tracks extending next to one another, the winding direction of the two conductor tracks being opposite with respect to one another so that the dummy turn does not supply any or a negligible contribution to the inductance of the booster antenna structure. [0071]

It is of particular interest that the turns or tracks in the Infineon publication are not shown crossing over one another, in which case they would form a "true" coil and contribute to the inductance of the booster antenna. Compare U.S. Pat. No. 8,130,166 (Assa Abloy; 2012) which shows (FIGS. 3, 5, 6 therein) crossovers for all of their spirals (booster antenna components). In the present invention, the antenna extension EA is in the form of a "true" coil, involves at least one crossover, and contributes to the inductance of the booster antenna BA.

Controlling Force and Ultrasonic Power During Wire Embedding

An embedding head (or tool) for embedding the wire for the booster antenna BA and its various components in the substrate may comprise an ultrasonic transducer (or sonotrode) vibrating a capillary tube through which the wire being embedded extends (or is fed) onto the surface of the substrate. By imparting an ultrasonic vibration of the tool while applying a downward force (urging the tool downward, with a force), the wire may be caused to embed itself, at least partially, into the surface of the card body CB substrate. Reference may be made to U.S. Pat. No. 6,698,089 (2004; Finn et al) and U.S. Pat. No. 6,233,818 (2001; Finn et al), incorporated by reference herein, which disclose embedding wire in a substrate using a sonotrode. See, for example, FIGS. 1 and 3 of the '089 patent.

The booster antenna (BA) (and any of its components CA, OW, IW, CC, AE) may comprise several turns of wire embedded very close to one another. When embedding the several turns of a booster antenna (BA), notably the peripheral card antenna (CA) portion thereof, it may be appreciated that the first turn of wire may be embedded in the "native" substrate of the card body (CB), and may interfere (resisting or blocking, in a manner of speaking) with the embedding of subsequent turns of the booster antenna (BA).

Figure 7:
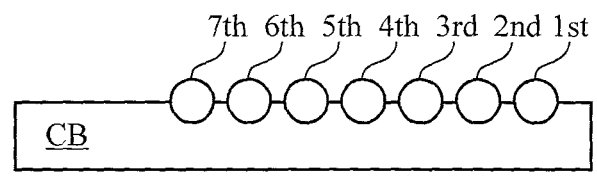
FIG. 7 is a cross-sectional illustration of wire coil comprising 7 windings embedded on a substrate of a card body (CB).

FIG. 7 shows the cross-section of a typical coil (booster antenna component) embedded on a substrate of a card body CB and shows the sequence used to scribe the 7 coil windings. A first ($1^{st}$) turn may be laid or embedded in the card body CB, followed by a second ($2^{nd}$) turn, followed by a third ($3^{rd}$) turn, followed by a fourth ($4^{th}$) turn, followed by a fifth ($5^{th}$) turn, followed by a sixth ($6^{th}$) turn, followed by the final seventh ($7^{th}$) turn. Evidently, when the second and subsequent turns are being embedded, the process can be resisted by the first and other previously-embedded turns.

A method is disclosed herein for controlling at least one of the downward force which is exerted by the embedding tool and a power of the ultrasonic vibration while embedding the wire in the surface of the substrate. Various benefits may be obtained, such as improved embedding of the wire, more consistent embedding of the wire, and reduced pitch (closer spacing) of turns of the wire in a booster antenna BA component (for example) which may allow for more turns of wire (hence, more inductance) in a given space (such as, but not limited to the peripheral area 146 of the card body CB).

Figure 7A:
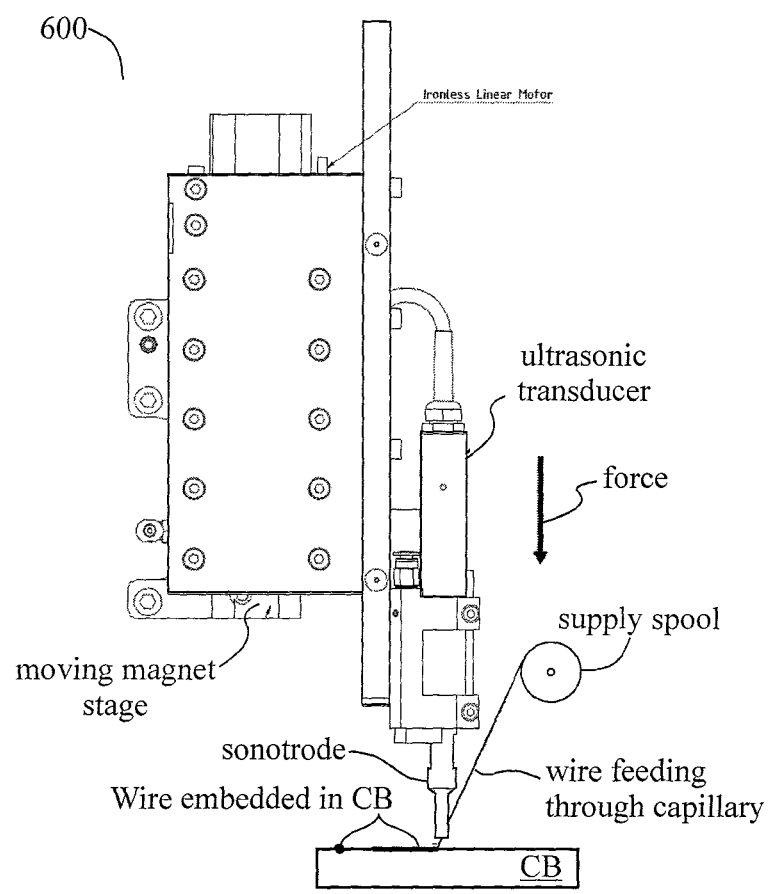
FIG. 7A is a diagram illustrating an embedding device based on a controlled sonotrode.

FIG. 7A shows a device 600 for embedding wire (such as for a booster antenna (BA) in a substrate (card body CB) may comprise an ultrasonic transducer a sonotrode a capillary with wire exiting (feeding out) from one end thereof means for urging the device downward with a given force The means for urging the device for embedding downward may comprise a linear actuator comprising a movable part with at least one coil and a fixed part having magnets. The downward force imparted to the capillary may be proportional to current flowing through the coil(s) of the movable part. For the purposes of this invention the downward motion of the device will be along an axis defined as the "z-axis", set perpendicular to the plane of the card body (CB). The plane of the card body (CB) will be denoted the "x-y plane" with the device moving across the x-y plane along an "x-axis" and a "y-axis" set perpendicular each other.

The embedding device 600 may be based on a controlled sonotrode. The device has a moving stage control system allowing downward force control.

An additional actuator (not shown), such as a pneumatic piston may be provided to apply an upward force to the capillary when current flow to the coil(s) is turned off, such as at the commencement and termination of the embedding operation.

According to an aspect of the invention, a force profile may be established so that the force of embedding can be controlled based on position, for example (but not limited to) applying a first force (f1) at the beginning of embedding, a second force (f2) during embedding a first turn of a booster antenna BA, a third force (f3) during embedding subsequent turns of the booster antenna BA, etc. An exemplary force profile is presented in FIG. 7B.

During embedding of the wire, either or both of the ultrasonic power provided by the sonotrode and the downward force exerted by the capillary may be controlled, and varied at different positions along the path of embedding the wire, to facilitate embedding. For example, power or force may be changed at turns (for example at the corner of the card body CB when embedding a rectangular spiral shaped card antenna CA). Better control over embedding may be achieved. Closer spacing of turns of a given booster antenna BA coil component (IW, OW, CC, AE) may be achieved.

Figure 7B:
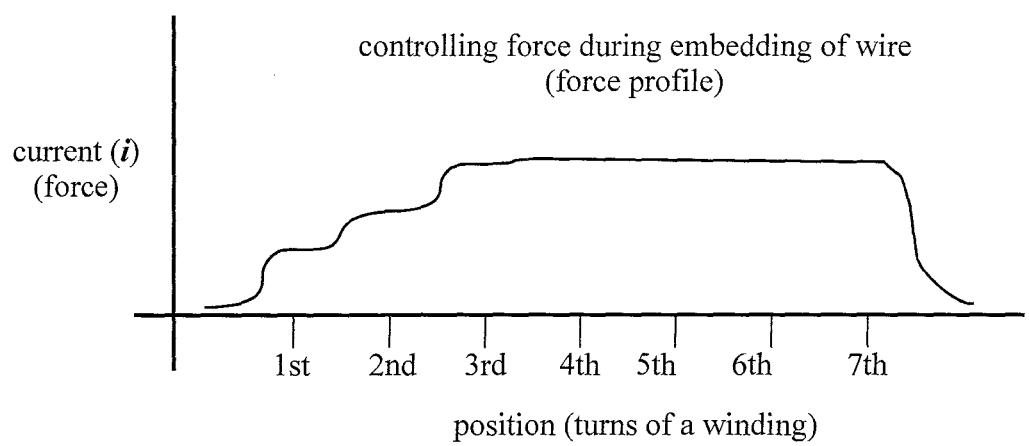
FIG. 7B is a graph illustrating an example of force profile for embedding a series of consecutive turns of a booster antenna (BA) into the substrate of a card body (CB)

FIG. 7B illustrates an example of force profile for embedding a series of consecutive turns of a booster antenna (BA) into the substrate of a card body (CB). (Ultrasonic power may be profiled in a similar manner.)

The downward force being applied, via the capillary, during embedding, may be increased or reduced, as desired, at any given location (position) on the substrate (card body CB) during embedding of wire, such as for the booster antenna (BA), including the peripheral card antenna (CA) portion thereof and the inner coupler coil (CC) thereof.

Typical forces may be in the range of a few hundred grams (a few Newtons). Given a typical sonotrode diameter of approximately 4 mm this gives typical pressures or the order of a few hundred kPa. The downward force being applied, via the capillary, during embedding, may be reduced to zero where the wire has to "jump over" previously-embedded wires. During embedding, control may be switched between downward force and vertical position of the capillary. The invention enables a high degree of control over the embedding process. During embedding, at any point in the X-Y plane of the card body (CB), several parameters can be controlled and varied. These include: the speed of movement over the entire device in the x-y plane, the power fed to the sonotrode, the height of the sonotrode above the sample (for example when performing a jump), the downward force exerted by the sonotrode during embedding. Of course, when making a cross-over, force may be reduced to nearly zero, and the ultrasonic power may (or may not) be turned off.

Controlling Bonding of a Wire

In some cases (other than the examples of embedding the booster antenna components which have been described herein), it may be necessary to bond the wire to bond pads on the card body, or on the RFID chip. For example, when bonding a wire of an antenna coil to a module tape MT for an antenna module AM, or wire bonding the RFID chip to the module tape MT.

Bonding of a wire to bond pads of a chip module CM or to contact pads of interconnects on the module tape MT may be realized using a thermode, which essentially welds the wire to the pad. The integrity of the bonds is of course important, and can be monitored with an optical inspection system. During bonding, the wire is deformed, and may exhibit a diameter which is (for example) approximately 30% smaller than its pre-bond diameter. A typical wire being bonded may have an initial diameter of 112 μm.

According to an embodiment of the invention, the position of the thermode may be measured, with micrometer precision, to achieve a deformation of the wire in a range of values centered around a target value representative of (for example) a 30% reduction in the diameter of the wire. The position of the thermode may be monitored to ensure that wires which are bonded are in this range, and when they are not, the thermode may be cleaned, or the process re-calibrated to ensure successful subsequent bonds.

Figure 8:
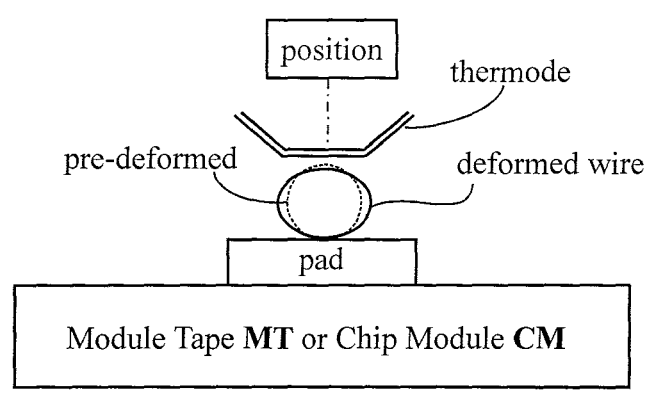
FIG. 8 is a diagram illustrating a technique for bonding a wire to a pad.

FIG. 8 shows a wire bonder comprising a thermode, and means for measuring position, and also shows a wire (pre-deformed) being bonded to a pad, and the resulting bonded wire which is deformed (squished). By precisely measuring the deformation of the wire as it is being bonded, the quality of the resulting bond can be inferred, with a high degree of confidence. As the thermode becomes dirty, the measured thickness may change, and the thermode can be cleaned.

While the invention(s) has/have been described with respect to a limited number of embodiments, these should not be construed as limitations on the scope of the invention(s), but rather as examples of some of the embodiments. Those skilled in the art may envision other possible variations, modifications, and implementations that are also within the scope of the invention(s), based on the disclosure(s) set forth herein.

What is claimed is:

1. A method of embedding a wire in a surface of a substrate, comprising:
   with an embedding tool, feeding wire onto the surface of the substrate while applying a given downward force and while imparting an ultrasonic vibration to the embedding tool;
   controlling at least one of the downward force which is exerted by the embedding tool and a power of the ultrasonic vibration while embedding the wire in the surface of the substrate; and
   establishing a force profile and applying different forces at different positions, during the embedding process, in a controlled manner.

2. The method of claim 1, wherein the embedding tool comprises:
   a linear actuator for urging at least a portion of the embedding tool downward.

3. The method of claim 1, further comprising:
   while controlling the force, controlling a power of the ultrasonic vibration imparted to the embedding tool.

4. The method of claim 1, wherein the substrate is a card body of a smart card.

5. The method of claim 1, wherein the substrate is an inlay substrate.

6. The method of claim 1, wherein the substrate is a substrate of a secure document.

7. The method of claim 1, wherein the substrate comprises one or more layers of material selected from the group consisting of Polyvinyl Chloride (PVC), Polycarbonate (PC), PET-G (Polyethylene Terephtalate Glycol-modified), Copolyester (Tritan), Teslin™, synthetic paper, paper and the like.

8. A method of embedding a wire in a surface of a substrate, comprising:
   with an embedding tool, feeding wire onto the surface of the substrate while applying a given downward force and while imparting an ultrasonic vibration to the embedding tool; and
   controlling at least one of the downward force which is exerted by the embedding tool and a power of the ultrasonic vibration while embedding the wire in the surface of the substrate;
   wherein:
   different downward forces are applied by the embedding tool at different positions being embedded.

9. The method of claim 8, wherein the substrate is a card body of a smart card.

10. The method of claim 8, wherein the substrate is an inlay substrate.

11. The method of claim 8, wherein the substrate is a substrate of a secure document.

12. The method of claim 8, wherein the substrate comprises one or more layers of material selected from the group consisting of Polyvinyl Chloride (PVC), Polycarbonate (PC), PET-G (Polyethylene Terephtalate Glycol-modified), Copolyester (Tritan), Teslin™, synthetic paper, paper and the like.

13. The method of claim 8, wherein the embedding tool comprises:
   a linear actuator for urging at least a portion of the embedding tool downward.

14. A method of embedding a wire in a surface of a substrate, comprising:
   with an embedding tool, feeding wire onto the surface of the substrate while applying a given downward force and while imparting an ultrasonic vibration to the embedding tool; and
   controlling at least one of the downward force which is exerted by the embedding tool and a power of the ultrasonic vibration while embedding the wire in the surface of the substrate;
   wherein the wire forms a booster antenna component having a plurality of turns, and further comprising:
   applying different downward forces depending upon which of the plurality of turns is being embedded.

15. The method of claim 14, wherein the substrate is a card body of a smart card.

16. The method of claim 14, wherein the substrate is an inlay substrate.

17. The method of claim 14, wherein the substrate is a substrate of a secure document.

18. The method of claim 14, wherein the substrate comprises one or more layers of material selected from the group consisting of Polyvinyl Chloride (PVC), Polycarbonate (PC), PET-G (Polyethylene Terephtalate Glycol-modified), Copolyester (Tritan), Teslin™, synthetic paper, paper and the like.

19. The method of claim 14, wherein the embedding tool comprises:
   a linear actuator for urging at least a portion of the embedding tool downward.

* * * * *